(12) United States Patent
Itasaka

(10) Patent No.: US 11,671,073 B2
(45) Date of Patent: Jun. 6, 2023

(54) VIBRATOR DEVICE

(71) Applicant: Seiko Epson Corporation, Tokyo (JP)

(72) Inventor: Yosuke Itasaka, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/584,436

(22) Filed: Jan. 26, 2022

(65) Prior Publication Data

US 2022/0239275 A1    Jul. 28, 2022

(30) Foreign Application Priority Data

Jan. 27, 2021 (JP) .............................. JP2021-011208

(51) Int. Cl.
| | |
|---|---|
| *H03H 9/05* | (2006.01) |
| *H03H 9/10* | (2006.01) |
| *H03B 5/04* | (2006.01) |
| *H03B 5/32* | (2006.01) |
| *H03H 9/19* | (2006.01) |

(52) U.S. Cl.
CPC ............ *H03H 9/0552* (2013.01); *H03B 5/04* (2013.01); *H03B 5/32* (2013.01); *H03H 9/1021* (2013.01); *H03H 9/19* (2013.01)

(58) Field of Classification Search
CPC .................................................. H03H 9/0552
USPC ........................................................... 331/66
See application file for complete search history.

(56) References Cited

U.S. PATENT DOCUMENTS

| | | | |
|---|---|---|---|
| 10,911,018 B2* | 2/2021 | Kamakura | ............... H03H 3/02 |
| 2020/0382095 A1* | 12/2020 | Kamakura | ............... H03B 5/36 |

FOREIGN PATENT DOCUMENTS

JP    2013-126052 A    6/2013

* cited by examiner

*Primary Examiner* — Joseph Chang
(74) *Attorney, Agent, or Firm* — Harness, Dickey & Pierce, P.L.C.

(57) ABSTRACT

A vibrator device includes a semiconductor substrate, a base, a vibrating element, and a lid. The semiconductor substrate has a first surface and a second surface which is in a front-back relationship with the first surface. The base includes an integrated circuit disposed on a first surface or a second surface. The vibrating element is electrically coupled to the integrated circuit and is disposed on the first surface side. The lid is joined to the base at a joining portion of the base to accommodate the vibrating element. The integrated circuit includes a passive element, and the passive element is disposed such that at least a part of the passive element overlaps with the joining portion in a plan view from a direction orthogonal to the first surface.

9 Claims, 13 Drawing Sheets

VIBRATOR DEVICE

The present application is based on, and claims priority from JP Application Serial Number 2021-011208, filed Jan. 27, 2021, the disclosure of which is hereby incorporated by reference herein in its entirety.

BACKGROUND

1. Technical Field

The present disclosure relates to a vibrator device or the like.

2. Related Art

In the related art, a vibrator device such as an oscillator is known as a device using a vibrating element. JP-A-2013-126052 discloses that as a vibrating element, a piezoelectric vibrator element is mounted on a semiconductor substrate such as a silicon substrate on which a circuit pattern of an integrated circuit is formed, and the piezoelectric vibrator element is packaged by being sealed with the semiconductor substrate and a lid.

Each of materials constituting a device and a package has a different thermal expansion coefficient so that stress is applied by performing packaging. Further, when the package is solder-mounted on an external circuit substrate, stress due to the difference in thermal expansion coefficient between the package and the circuit substrate, stress due to fixing the package and the circuit substrate with an underfill agent, or the like is generated, and then deformation of curvature of an integrated circuit due to these stresses affects the characteristics of the device. Since the method of generating the stress depends on the package structure, it is required to design a layout of the integrated circuit in consideration of the stress generated due to the package structure. JP-A-2013-126052 does not consider such a situation.

SUMMARY

An aspect of the present disclosure relates to a vibrator device including: a base including a semiconductor substrate, which has a first surface and a second surface that is in a front-back relationship with the first surface, and an integrated circuit, which is disposed on the first surface or the second surface; a vibrating element electrically coupled to the integrated circuit and disposed on a first surface side; and a lid joined to the base at a joining portion of the base so as to accommodate the vibrating element, in which the integrated circuit includes a passive element, and the passive element is disposed such that at least a part of the passive element overlaps with the joining portion in a plan view from a direction orthogonal to the first surface.

Another aspect of the present disclosure relates to a vibrator device including: a base including a semiconductor substrate, which has a first surface and a second surface that is in a front-back relationship with the first surface, and an integrated circuit, which is disposed on the first surface or the second surface; a vibrating element electrically coupled to the integrated circuit and disposed on a first surface side; and a lid joined to the base at a joining portion of the base so as to accommodate the vibrating element, in which the integrated circuit includes at least one of a reference voltage generation circuit that generates a reference voltage used in the integrated circuit and a regulator circuit that generates a regulated power supply voltage used in the integrated circuit, and at least a part of a passive element or an active element included in at least one of the reference voltage generation circuit and the regulator circuit is disposed so as to overlap with the joining portion in a plan view from a direction orthogonal to the first surface.

Still another aspect of the present disclosure relates to a vibrator device including: a base including a semiconductor substrate, which has a first surface and a second surface that is in a front-back relationship with the first surface, and an integrated circuit, which is disposed on the first surface or the second surface; a vibrating element electrically coupled to the integrated circuit and disposed on a first surface side; and a lid joined to the base at a joining portion of the base so as to accommodate the vibrating element, in which the integrated circuit includes at least one of a temperature sensor that detects temperature and a temperature compensation circuit that performs a temperature compensation of an oscillation frequency of the vibrating element, and at least a part of a passive element or an active element included in at least one of the temperature sensor and the temperature compensation circuit is disposed so as to overlap with the joining portion in a plan view from a direction orthogonal to the first surface.

BRIEF DESCRIPTION OF THE DRAWINGS

FIG. 10 is a plan view illustrating an example of a disposition of a through electrode, an external coupling terminal, an integrated circuit, and the like.

FIG. 17 is a plan view illustrating another example of a disposition of the through electrode, the external coupling terminal, the integrated circuit, and the like.

DESCRIPTION OF EXEMPLARY EMBODIMENTS

Hereinafter, the present embodiment will be described. The present embodiment to be described below does not unduly limit the contents of the disclosure described in aspects. Further, all configurations to be described in the present embodiment are not limited to being essential constituent conditions. Further, in each of the following drawings, some components may be omitted for convenience of explanation. Further, in each drawing, the dimensional ratio of each component is different from the actual one for the sake of clarity.

Figure 1:
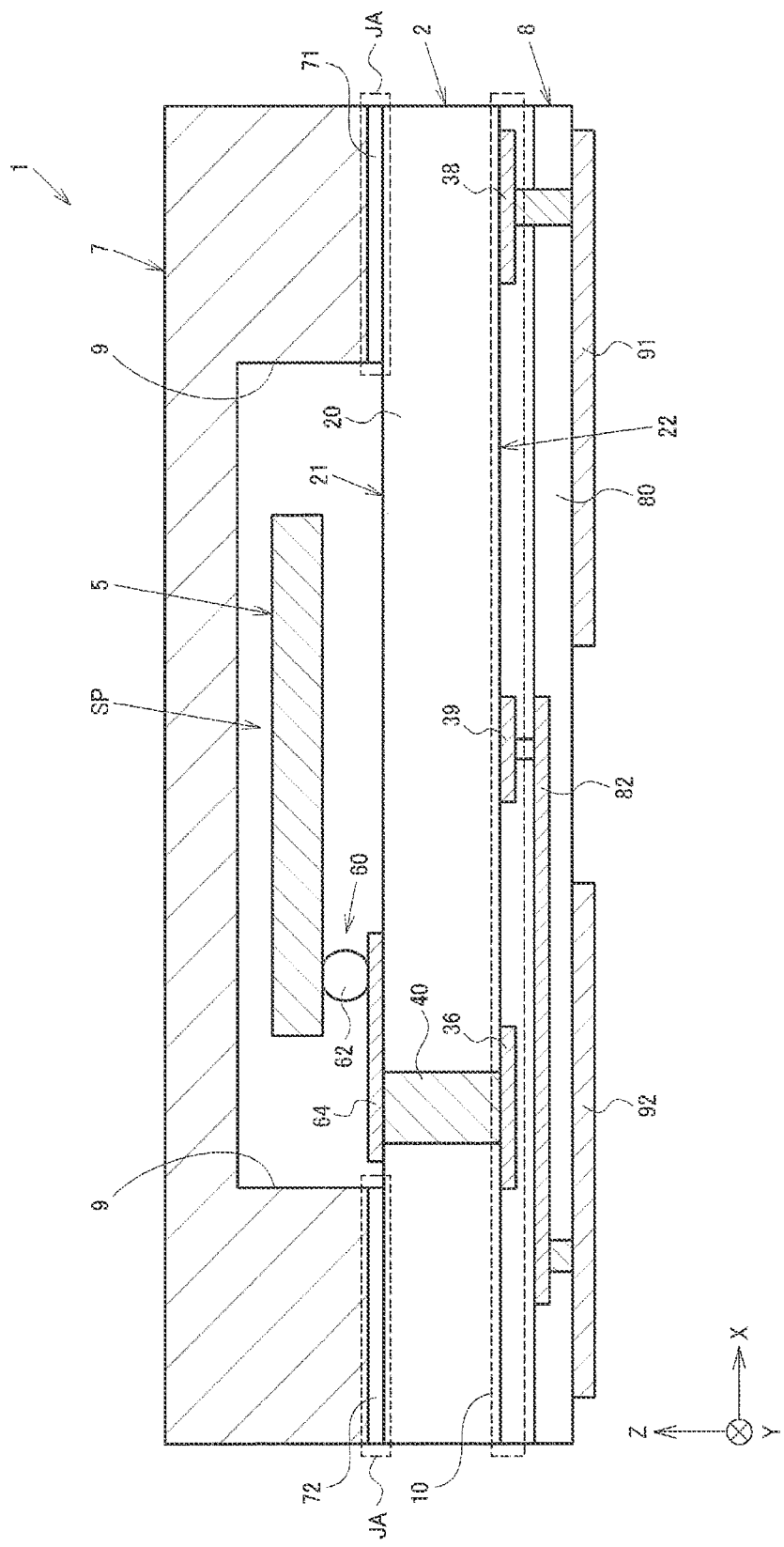
FIG. 1 is a cross-sectional view illustrating an example of a configuration of a vibrator device of the present embodiment.

FIG. 1 is a cross-sectional view illustrating an example of a configuration of a vibrator device 1 of the present embodiment. As illustrated in FIG. 1, the vibrator device 1 of the present embodiment includes a base 2, a vibrating element 5, and external coupling terminals 91 and 92.

Further, the vibrator device 1 can include a lid 7 or a redisposition wiring layer 8. The base 2 includes a semiconductor substrate 20 and a through electrode 40. The semiconductor substrate 20 has a first surface 21 and a second surface 22 which is in a front-back relationship with the first surface 21. The first surface 21 is, for example, the upper surface of the semiconductor substrate 20, and the second surface 22 is, for example, a lower surface of the semiconductor substrate 20. The through electrode 40 is an electrode that passes through the first surface 21 and the second surface 22 of the semiconductor substrate 20. The vibrating element 5 is disposed on the first surface 21 side of the semiconductor substrate 20. For example, the vibrating element 5 is disposed at a position separated from the first surface 21 of the semiconductor substrate 20 by a predetermined given separation distance. Specifically, the vibrating element 5 is fixed to the first surface 21 of the semiconductor substrate 20 via, for example, a joining member 60 having conductivity. The external coupling terminals 91 and 92 are provided on the second surface 22 side of the semiconductor substrate 20 via an insulation layer 80 or the like. The insulation layer 80 is, for example, an insulation layer constituting the redisposition wiring layer 8.

In each of the drawings described in the present embodiment, the X axis, the Y axis, and the Z axis are illustrated as three axes orthogonal to each other. A direction along the X axis is referred to as an "X axis direction", a direction along the Y axis is referred to as a "Y axis direction", and a direction along the Z axis is referred to as a "Z axis direction". Further, a distal end side of an arrow in each axis direction is also referred to as a "plus side", a base end side thereof is referred to as a "minus side", the plus side in the Z axis direction is referred to as an "upper", and the minus side in the Z axis direction is also referred to as a "lower". For example, the Z axis direction is along the vertical direction, and the XY plane is along the horizontal plane. FIG. 1 is a cross-sectional view of the vibrator device 1 in a cross-sectional view from the Y axis direction. The first surface 21 and the second surface 22 of the semiconductor substrate 20 are surfaces along the XY plane and surfaces orthogonal to the Z axis. The "orthogonal" includes not only those intersecting at 90° but also those intersecting at an angle slightly inclined from 90°.

The vibrator device 1 is, for example, an oscillator. Specifically, the vibrator device 1 is an oscillator such as a simple package quartz crystal oscillator (SPXO), a voltage controlled quartz crystal oscillator (VCXO), a temperature compensated crystal oscillator (TCXO), a quartz crystal oscillator with a constant temperature oven (OCXO), a surface acoustic wave (SAW) oscillator, a voltage controlled SAW oscillator or a micro electro mechanical systems (MEMS) oscillator. The MEMS oscillator can be implemented by a MEMS vibrating element in which a piezoelectric film and an electrode are disposed on a substrate such as a silicon substrate. However, the vibrator device 1 may be an inertial sensor such as an acceleration sensor and an angular speed sensor, a force sensor such as an inclination sensor, or the like.

The base 2 is constituted by the semiconductor substrate 20. The semiconductor substrate 20 is, for example, a silicon substrate. The semiconductor substrate 20 is not limited to a silicon substrate and may be a semiconductor substrate such as Ge, GaP, GaAs, or InP, but it is desirable that a relationship with a lid 7 described later can be taken into consideration.

The base 2 also includes the integrated circuit 10. The integrated circuit 10 which is a semiconductor circuit is formed on the second surface 22 of the semiconductor substrate 20. The integrated circuit 10 is constituted by a plurality of circuit elements.

The circuit element is, for example, an active element such as a transistor, or a passive element such as a capacitor or a resistor. Specifically, in the integrated circuit 10, each circuit block is constituted by a plurality of circuit blocks in which each circuit block includes a plurality of circuit elements. Further, the integrated circuit 10 is formed by a diffusion region, which is an impurity region formed by doping impurities on the semiconductor substrate 20, and a wiring layer in which a metal layer and an insulation layer are laminated. A source region and a drain region of a transistor, which are the circuit elements of the integrated circuit 10, are formed by the diffusion region, and a wiring, which couples between the circuit elements, is formed by the wiring region.

The base 2 also includes the through electrode 40. The through electrode 40 is made of a conductive material that passes through the first surface 21 and the second surface 22 of the semiconductor substrate 20. For example, a through hole is formed with respect to the semiconductor substrate 20, and the through electrode 40 is formed by filling the through hole with a conductive material. The conductive material may be a metal such as copper or may be conductive polysilicon or the like. The conductive polysilicon refers to polysilicon imparted with conductivity by doping impurities such as phosphorus (P), boron (B), and arsenic (As). When polysilicon is used as the conductive material, it is possible to implement the through electrode 40 having sufficient resistance with respect to heat applied in the process of forming the integrated circuit 10.

One end of the through electrode 40 is electrically coupled to the vibrating element 5 via a joining member 60 having conductivity. In FIG. 1, the joining member 60 having conductivity is implemented by a bump 62 or the like, one end of which is electrically coupled to the vibrating element 5 and the other end of which is electrically coupled to the through electrode 40. Specifically, the other end of the bump 62 is coupled to the through electrode 40 via a terminal 64. The bump 62 is a bump having conductivity, specifically a metal bump. The joining member 60 having conductivity may be implemented by using an adhesive having conductivity or the like.

The other end of the through electrode 40 is electrically coupled to the integrated circuit 10. Specifically, the other end of the through electrode 40 is coupled to the circuit element of the integrated circuit 10 via a contact pad 36 formed in the integrated circuit 10. In this way, the vibrating element 5 and the integrated circuit 10 can be electrically coupled via the through electrode 40.

The lid 7 is joined to a joining portion JA of the base 2 via joining members 71 and 72. An accommodation space SP having airtightness is formed by the base 2 and the lid 7 which is a cover, and the vibrating element 5 is accommodated in this accommodation space SP. The accommodation space SP is hermetically sealed, and the inside of the accommodation space SP is, for example, in a depressurization state. As a result, the vibrating element 5 can be suitably protected from impact, dust, heat, humidity, or the like, and can be driven stably. The state inside the accommodation space SP is not limited to the depressurization state, and the inside of the accommodation space SP may be, for example, an atmosphere of an inert gas such as argon or nitrogen.

The lid 7 can be implemented by a silicon substrate similar to the base 2. As a result, the thermal expansion coefficients of the base 2 and the lid 7 become equal, and the generation of thermal stress due to thermal expansion can be reduced. Further, both the base 2 and the lid 7 can be formed by a semiconductor manufacturing process. Therefore, the vibrator device 1 can be manufactured with high accuracy, and the size of the vibrator device 1 can be reduced. The lid 7 is not limited to a silicon substrate and may be implemented by a semiconductor substrate such as Ge, GaP, GaAs, or InP. However, in the present embodiment, it is desirable that the materials of the lid 7 and the base 2 are the same as each other, or have the same thermal expansion coefficient. The same includes substantially the same.

The redisposition wiring layer 8 is provided on the second surface 22 side of the semiconductor substrate 20 and includes the insulation layer 80 and a wiring 82 for redisposition wiring. The insulation layer 80 is implemented by a resin such as a polyimide or epoxy glass, and the wiring 82 is implemented by a metal wiring such as copper foil. The insulation layer 80 needs to have heat resistance that can withstand soldering when the vibrator device 1 is mounted, and it is desirable to use polyimide. Further, as the material of the wiring 82, a metal material such as aluminum or silver may be used in addition to copper. The thickness of the wiring layer or the terminal in the redisposition wiring layer 8 is, for example, substantially 10 to 20 μm. By providing the redisposition wiring layer 8, the contact pads 38 and 39 formed in the integrated circuit 10 and the external coupling terminals 91 and 92 can be electrically coupled to each other. By performing the mounting that couples the external coupling terminals 91 and 92 of the vibrator device 1 to the terminal or wiring of the circuit substrate or the like on which the vibrator device 1 is mounted, the vibrator device 1 can be incorporated into an electronic device. Further, by providing such a redisposition wiring layer 8, it is possible to mechanically protect a part of the integrated circuit 10 or thermally protect the integrated circuit 10 or the like from the heat in the soldering process when mounting the vibrator device 1.

Figure 2:
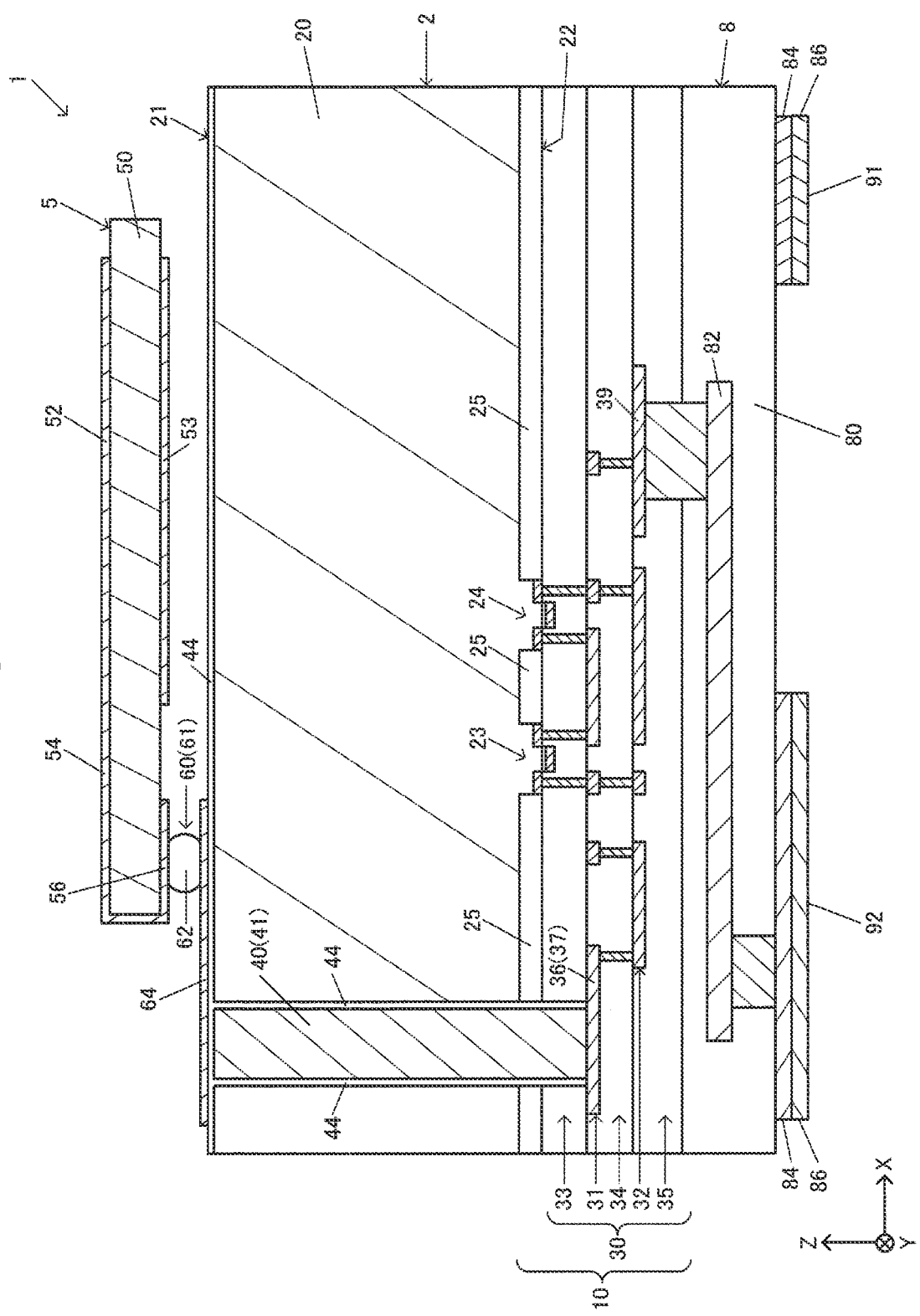
FIG. 2 is a cross-sectional view illustrating an example of a specific configuration of the vibrator device of the present embodiment.
Figure 3:
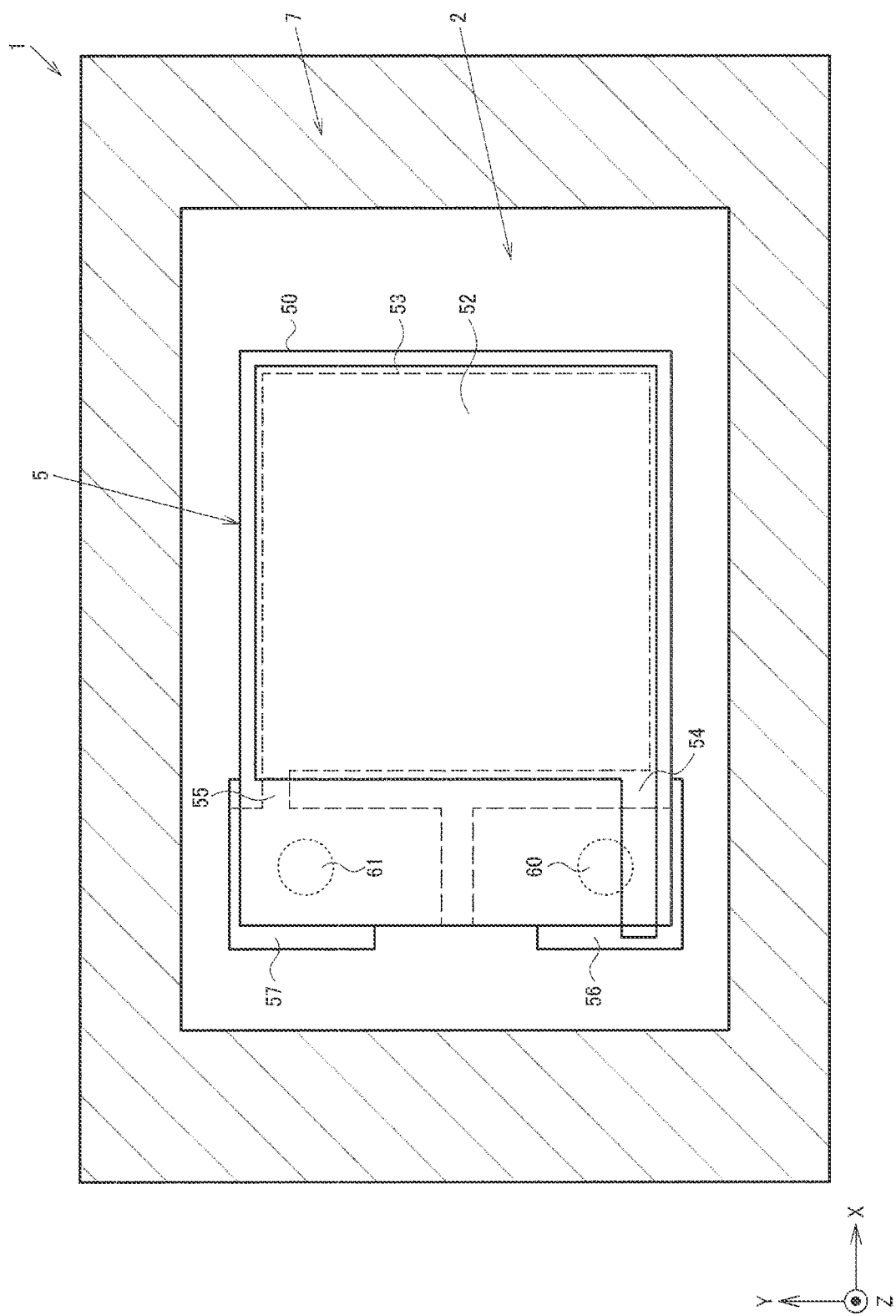
FIG. 3 is a plan view illustrating an example of a vibrating element of the vibrator device.

FIG. 2 is a cross-sectional view illustrating an example of a specific configuration of the vibrator device 1, and FIG. 3 is a plan view illustrating an example of the vibrating element 5 of the vibrator device 1. First, the details of the vibrating element 5 will be described with reference to FIG. 3.

The vibrating element 5 is an element generating the mechanical vibration by an electric signal. For example, as illustrated in FIG. 3, the vibrating element 5 has a vibration substrate 50 and an electrode disposed on a surface of the vibration substrate 50. The vibration substrate 50 has a thickness sliding vibration mode and is formed of an AT cut quartz crystal substrate in the present embodiment. The AT cut quartz crystal substrate has a third-order frequency-temperature characteristics so that the AT cut quartz crystal substrate is the vibrating element 5 having excellent temperature characteristics. Further, an electrode has an excitation electrode 52 disposed on the upper surface of the vibration substrate 50 and an excitation electrode 53 disposed on the lower surface that faces the excitation electrode 52. The upper surface is a surface on the plus side in the Z axis direction, and the lower surface is a surface on the minus side in the Z axis direction. Further, one of the excitation electrodes 52 and 53 is a first excitation electrode, and the other of the excitation electrodes 52 and 53 is a second excitation electrode. Further, the electrode has a pair of terminals 56 and 57 disposed on the lower surface of the vibration substrate 50, a wiring 54 electrically coupling the terminal 56 and the excitation electrode 52, and a wiring 55 electrically coupling the terminal 57 and the excitation electrode 53.

The configuration of the vibrating element 5 is not limited to the above configuration. For example, the vibrating element 5 may have a mesa type in which the vibration region that is interposed between the excitation electrodes 52 and 53 protrudes from the surroundings, or conversely, may have an inverted mesa type in which the vibration region is recessed from the surroundings. Further, bevel processing for grinding the surroundings of the vibration substrate 50 or convex processing for making the upper surface and the lower surface convex curved surfaces may be performed. Further, the vibrating element 5 is not limited to the one that vibrates in the thickness sliding vibration mode. For example vibrating element 5 may be a tuning fork type vibrating element, in which a plurality of vibrating arms perform a flexural vibration in the in-plane direction, a tuning fork type vibrating element, in which a plurality of vibrating arms perform the flexural vibration in the out-plane direction, a gyro sensor element, which includes a driving arm performing a drive vibration and a detecting arm performing a detection vibration and detects an angular speed, or an acceleration sensor element that includes a detection portion detecting acceleration. The vibration substrate 50 is not limited to that formed from the AT cut quartz crystal substrate and may be formed of a quartz crystal substrate other than the AT cut quartz crystal substrate, for example, an X cut quartz crystal substrate, a Y cut quartz crystal substrate, a Z cut quartz crystal substrate, a BT cut quartz crystal substrate, an SC cut quartz crystal substrate, an ST cut quartz crystal substrate, or the like. Further, in the present embodiment, the vibration substrate 50 is constituted by a quartz crystal, but the vibration substrate 50 is not limited to this, and for example, the vibration substrate 50 may be constituted by a piezoelectric single crystal body such as Lithium Niobate, Lithium Tantalate, Lithium Tetraborate, Potassium Niobate, and Gallium Phosphate, and may be constituted by a piezoelectric single crystal body other than the above examples. Further, the vibrating element 5 is not limited to the piezoelectric drive type vibrating element and may be an electrostatic drive type vibrating element using an electrostatic force.

Figure 10:
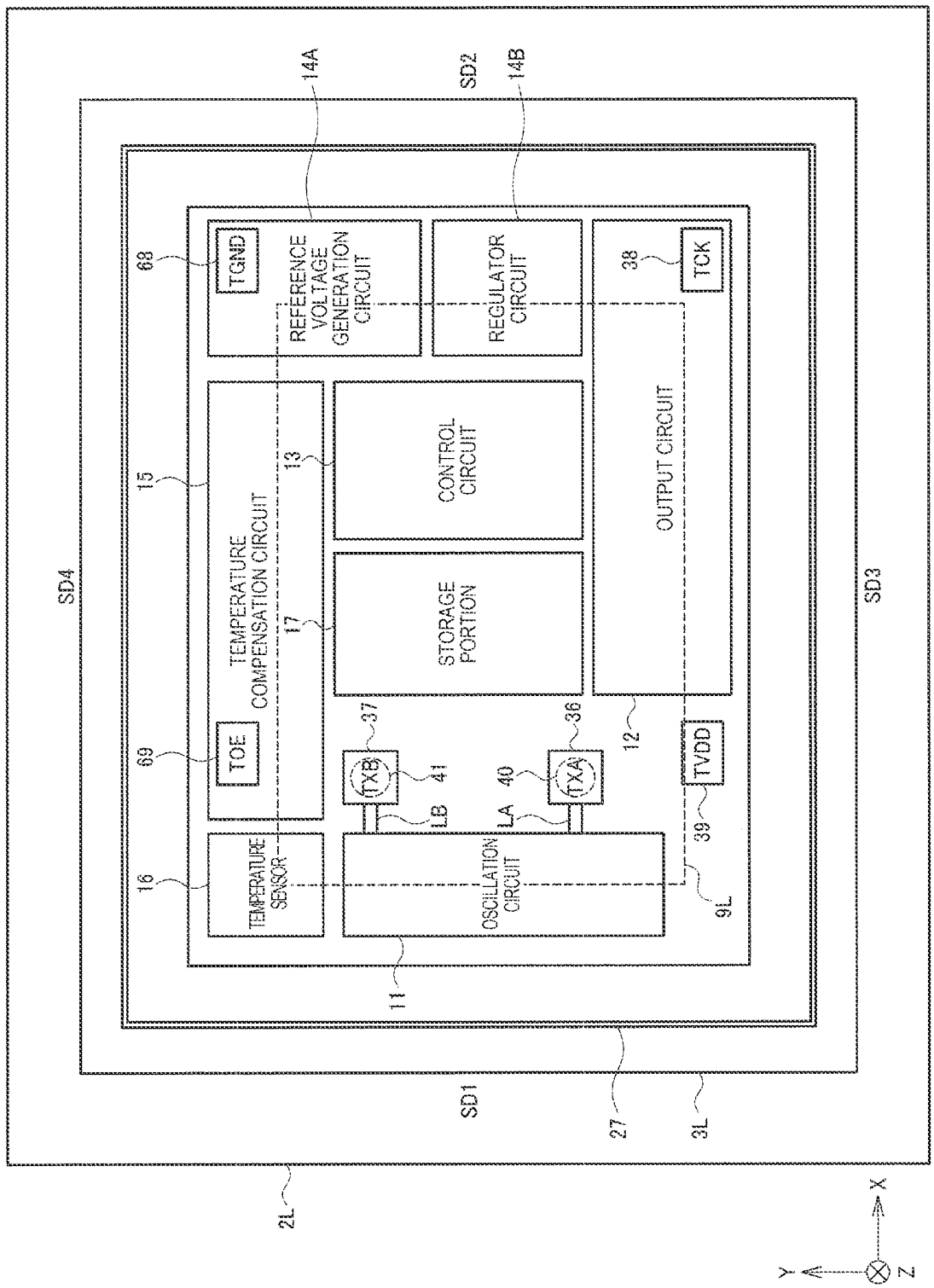

As illustrated in FIGS. 2 and 3, the vibrating element 5 is fixed to the first surface 21 which is the upper surface of the semiconductor substrate 20, via the joining members 60 and 61 having conductivity. Although not illustrated in FIG. 2, as illustrated in FIG. 3, for example, two joining members 60 and 61 are provided along the Y axis direction. Further, as illustrated in FIG. 10 described later, the semiconductor substrate 20 is provided with, for example, two through electrodes 40 and 41 along the Y axis direction, and these through electrodes 40 and 41 are electrically coupled to the vibrating element 5 via the joining members 60 and 61 having conductivity. One of the through electrodes 40 and 41 is a first through electrode, and the other of the through electrodes 40 and 41 is a second through electrode. Specifically, one end of the through electrode 40 is electrically coupled to the excitation electrode 52 of the vibrating element 5 via the joining member 60, the terminal 56 of the vibrating element 5, and the wiring 54. Further, one end of the through electrode 41 is electrically coupled to the excitation electrode 53 of the vibrating element 5 via the joining member 61, the terminal 57 of the vibrating element 5, and the wiring 55. The other end of the through electrodes 40 and 41 is electrically coupled to the integrated circuit 10. As a result, the vibrating element 5 and the integrated circuit 10 are electrically coupled via the through electrodes 40 and 41. Specifically, the other end of the through electrodes 40 and 41 is electrically coupled to the oscillation circuit 11 of the integrated circuit 10 via the contact pads 36 and 37 illustrated in FIGS. 2 and 10. As a result, the vibrating element 5 and the oscillation circuit 11 are electrically coupled via the through electrodes 40 and 41.

The joining members 60 and 61 are not particularly limited as long as the joining members 60 and 61 have both conductivity and joinability, and for example, it can be implemented by various bumps 62 having conductivity such as gold bumps, silver bumps, copper bumps, solder bumps, and resin core bumps. Alternatively, as the joining members 60 and 61, a conductive adhesive or the like may be used in which a conductive filler such as a silver filler is dispersed in various adhesives of polyimide based, epoxy based, silicone based, or acrylic based.

Further, when the semiconductor substrate 20 is thermally oxidized after the through hole is formed, an insulation layer 44, which is an insulation film made of, for example, silicon oxide ($SiO_2$), is formed on the first surface 21 of the semiconductor substrate 20 or the inner surface of the through hole. By forming the insulation layer 44 by the thermal oxidation, a dense and homogeneous insulation layer 44 can be formed on the surface of the semiconductor substrate 20. Further, a difference in linear expansion coefficient between the insulation layer 44 and the semiconductor substrate 20 can be reduced. Therefore, the thermal stress is less likely to be generated, and the vibrator device 1 having excellent oscillation characteristics can be implemented. The constituent material of the insulation layer 44 is not particularly limited, and may be constituted by, for example, silicon nitride (SiN) or may be constituted by resin. The method of forming the insulation layer 44 is not limited to the thermal oxidation and may be formed by, for example, a chemical vapor deposition (CVD).

The through electrodes 40 and 41 are formed by filling the inside of the insulation layer 44 of the through hole with a conductive material such as copper or conductive polysilicon. That is, the through electrodes 40 and 41 are formed by filling the inside of the through hole with the conductive material. One end of the through electrodes 40 and 41 is electrically coupled to the vibrating element 5. Specifically, one end of the through electrodes 40 and 41 is electrically coupled to the excitation electrodes 52 and 53 of the vibrating element 5. On the other hand, the other end of the through electrodes 40 and 41 is electrically coupled to the integrated circuit 10. Specifically, the other end of the through electrodes 40 and 41 is electrically coupled to the oscillation circuit 11 of the integrated circuit 10 via the contact pads 36 and 37.

As illustrated in FIG. 2, the integrated circuit 10 is constituted by, for example, an N type transistor 23 or a P type transistor 24. These transistors 23 and 24 are constituted by a source region and a drain region, which are diffusion regions formed on the semiconductor substrate 20, a gate electrode, and a gate oxide film. Further, the transistors 23 and 24 are element-separated by an element separation film 25 called local oxidation of silicon (LOCOS). Further, the integrated circuit 10 includes a wiring layer 30 that implements coupling wiring between a plurality of circuit elements such as the transistors 23 and 24.

For example, the wiring layer 30 in FIG. 2 includes metal layers 31 and 32, and insulation layers 33, 34, and 35. The metal layers 31 and 32 are a first metal layer and a second metal layer, respectively, and the insulation layers 33, 34, and 35 are a first insulation layer, a second insulation layer, and a third insulation layer, respectively. The metal layer 31 is formed between the insulation layer 33 and the insulation layer 34, and the metal layer 32 is formed between the insulation layer 34 and the insulation layer 35. These metal layers 31 and 32 are implemented by a metal such as aluminum or copper, for example. Further, the metal layer 31 and the metal layer 32 are electrically coupled by a contact called a via contact, and the metal layer 31 and the source region or the drain region of the transistors 23 and 24 are electrically coupled by the contact. As illustrated in FIG. 2, the contact pad 36, which is electrically coupled to the other end of the through electrodes 40 and 41, is formed by a lower metal layer 31. Further, the contact pads 38 and 39, which are electrically coupled to the external coupling terminals 91 and 92, are formed by an upper metal layer 32. In the wiring layer 30, in the integrated circuit 10, a layer closer to the transistors 23 and 24 is defined as a lower layer, and a layer farther from the transistors 23 and 24 is defined as an upper layer. Further, FIG. 2 illustrates a case where the wiring layer 30 has two metal layers 31 and 32, but the present embodiment is not limited to this, and the wiring layer 30 may have three or more metal layers. In this case, the contact pads 36 and 37 are formed by the lowermost metal layer of the plurality of metal layers, and the contact pads 38 and 39 are formed by the uppermost metal layer. Further, a passivation film is formed by the uppermost insulation layer 35 made of an insulating resin such as polyimide.

The redisposition wiring layer 8 includes the insulation layer 80 implemented by a resin layer such as a polyimide or epoxy glass, and the wiring 82 implemented by a copper foil or the like. The contact pad 38 is electrically coupled to the external coupling terminal 91, and the contact pad 39 is electrically coupled to the external coupling terminal 92 via the wiring 82.

Further, in FIG. 2, each of the external coupling terminals 91 and 92 has a two-layer structure having a first metal layer 84 and a second metal layer 86. As the first metal layer 84 on the insulation layer 80 side, for example, a titanium tungsten layer is used in order to improve the adhesion with the insulation layer 80. As the second metal layer 86, for example, a metal layer such as copper or gold that can be easily soldered to an external terminal or wiring is used.

Figure 4:
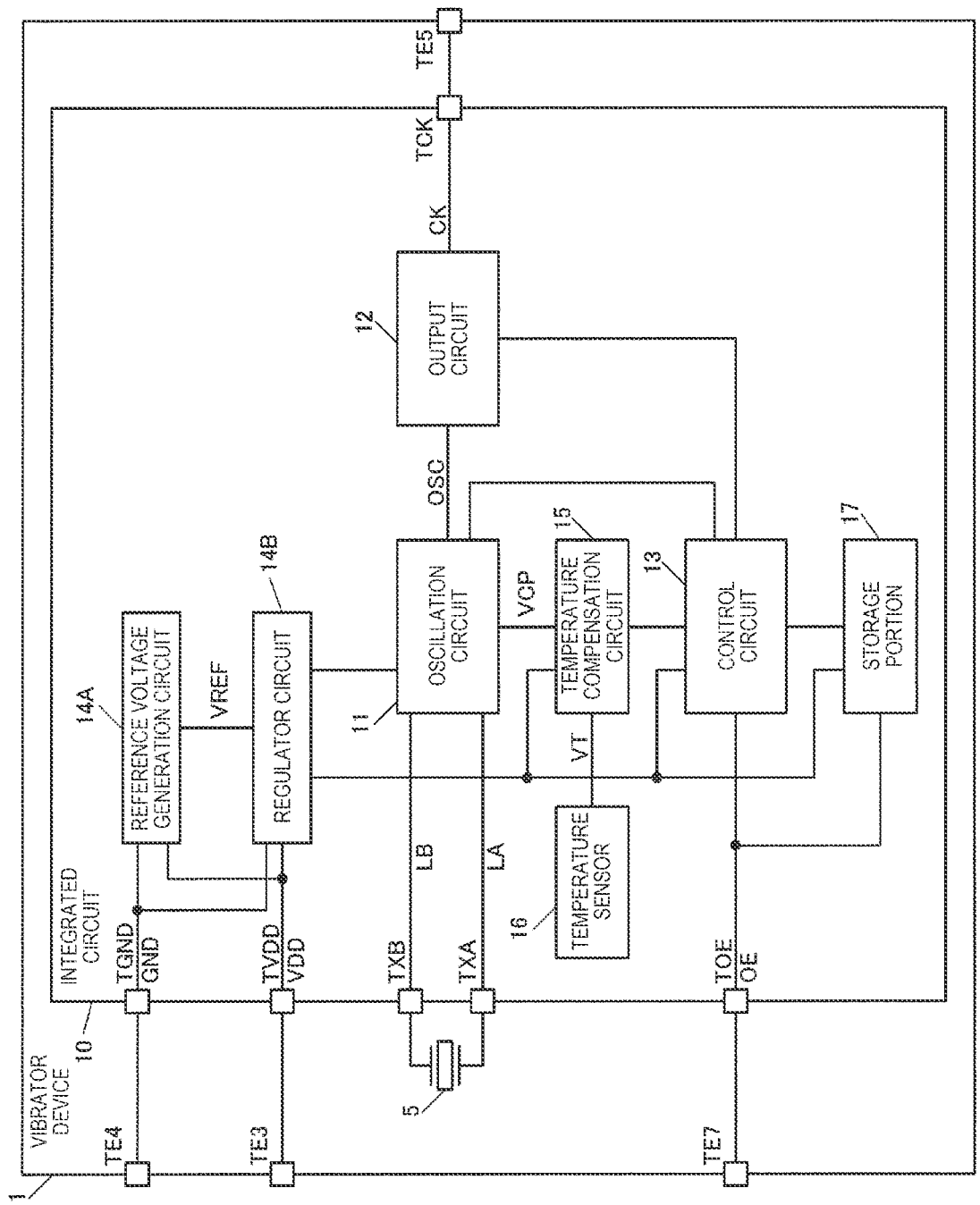
FIG. 4 is a block view illustrating an example of a configuration of an integrated circuit.

FIG. 4 illustrates an example of a configuration of the integrated circuit 10 of the present embodiment. The integrated circuit 10 of the present embodiment can include a terminal TXA, a terminal TXB, a terminal TCK, a terminal TVDD, a terminal TGND, a terminal TOE, an oscillation circuit 11, an output circuit 12, a control circuit 13, a reference voltage generation circuit. 14A, a regulator circuit 14B, a temperature compensation circuit 15, a temperature sensor 16, and a storage portion 17. Further, the vibrator device 1 of the present embodiment includes the vibrating element 5 and the integrated circuit 10.

The oscillation circuit 11 is a circuit that oscillates the vibrating element 5. For example, the oscillation circuit 11 is electrically coupled to the terminal TXA and the terminal TXB and generates an oscillation signal OSC by causing the vibrating element 5 to oscillate. For example, the oscillation circuit 11 oscillates the vibrating element 5 by driving the vibrating element 5 via the wiring LA and the wiring LB which are coupled to the terminal TXA and the terminal TXB. For example, the oscillation circuit 11 includes a drive circuit for oscillation or the like provided between the terminal TXA and the terminal TXB. Although details will be described later in FIG. 11, the oscillation circuit 11 can be implemented by a transistor such as a bipolar transistor that implements a drive circuit 132 and a passive element such as the capacitor or the resistor. The drive circuit 132 is a core circuit of the oscillation circuit 11, and the drive circuit 132 oscillates the vibrating element 5 by current driving or voltage driving the vibrating element 5. As the oscillation circuit 11, various types of oscillation circuits can be used such as a Pierce type, a Colpitts type, an inverter type, or a Hartley type. Further, as will be described in detail later in FIG. 11, the oscillation circuit 11 may be provided with a variable capacitance circuit or the like, and the oscillation frequency may be adjusted by adjusting the capacitance of the variable capacitance circuit. More specifically, the oscillation circuit 11 may have a first variable capacitance circuit 136 electrically coupled to the wiring LA to which the terminal TXA is coupled, and have a second variable capacitance circuit 137 electrically coupled to the wiring LB to which the terminal TXB is coupled. The coupling in the present embodiment is an electrical coupling. The electrical coupling is coupling to which an electrical signal is transmittable, and coupling that enables the transmission of information by an electrical signal. The electrical coupling may be coupling via a passive element or the like.

The output circuit 12 outputs a clock signal CK based on the oscillation signal OSC from the oscillation circuit 11. For example, the output circuit 12 outputs the clock signal CK by buffering the oscillation signal OSC from the oscillation circuit 11. For example, the output circuit 12 can also perform a waveform shaping of the oscillation signal OSC, level-shift of the voltage level, or the like. A signal format of the clock signal output by the output circuit 12 is, for example, a signal format such as a single ended CMOS or a clipped sine wave, but is not limited to this. For example, the signal format may be a signal format such as a low voltage differential signaling (LVDS), a positive emitter coupled logic (PECL), an high speed current steering logic (HCSL), or a differential complementary MOS (CMOS).

The control circuit 13 performs various control processes. For example, the control circuit 13 controls the entire integrated circuit 10. For example, the control circuit 13 controls an operation sequence of the integrated circuit 10. Further, the control circuit 13 performs various processes for controlling the oscillation circuit 11. The control circuit 13 can also control the output circuit 12 and the like. The control circuit 13 can be implemented, for example, by an application specific integrated circuit (ASIC) using automatic placement and wiring such as a gate array.

The temperature sensor 16 is a sensor that detects the temperature. Specifically, the temperature sensor 16 outputs a temperature dependent voltage that changes according to the temperature of the environment as a temperature detection voltage VT. For example, the temperature sensor 16 generates the temperature detection voltage VT by utilizing a circuit element having a temperature dependency. Specifically, the temperature sensor 16 uses a temperature dependency of a forward voltage of the PN junction to output a temperature detection voltage VT in which a voltage value changes depending on the temperature. As the forward voltage of the PN junction, for example, the voltage between the base and the emitter of the bipolar transistor can be used.

The temperature compensation circuit 15 performs a temperature compensation of the oscillation frequency of the oscillation circuit 11. For example, the temperature compensation circuit 15 generates a temperature compensated voltage VCP based on the temperature detection voltage VT from the temperature sensor 16 and outputs the temperature compensated voltage VCP to the oscillation circuit 11 to perform the temperature compensation of the oscillation frequency of the oscillation circuit 11. For example, the temperature compensation circuit 15 performs the temperature compensation by outputting the temperature compensated voltage VCP, which is the capacitance control voltage of the variable capacitance circuit, with respect to the variable capacitance circuit included in the oscillation circuit 11. The temperature compensation is, for example, a process of compensating by reducing fluctuations in the oscillation frequency caused by the temperature fluctuations.

For example, the temperature compensation circuit 15 performs an analog type temperature compensation by polynomial approximation. For example, when the temperature compensated voltage VCP that compensates for the frequency-temperature characteristics of the vibrating element 5 is approximated by a polynomial, the temperature compensation circuit 15 performs the analog type temperature compensation based on the coefficient information of the polynomial. The analog type temperature compensation is a temperature compensation implemented by, for example, an adding process of a current signal or a voltage signal which is an analog signal. For example, when the temperature compensated voltage VCP is approximated by the high-order polynomial, the zeroth-order coefficient, the first-order coefficient, and the high-order coefficient of the polynomial are stored in the storage portion 17 as zeroth-order correction data, first-order correction data, and high-order correction data, respectively. For example, the coefficients are stored in the storage portion 17 implemented by the non-volatile memory. The high-order coefficient is, for example, a coefficient of the degree of a high-order that is larger than the first-order, and the high-order correction data is correction data corresponding to the high-order coefficient. For example, when the temperature compensated voltage VCP is approximated by the fifth-order polynomial, the zeroth-order coefficient, the first-order coefficient, the second-order coefficient, the third-order coefficient, the fourth-order coefficient, and the fifth-order coefficient of the polynomial are stored in the storage portion 17 as zeroth-order correction data, first-order correction data, second-order correction data, third-order correction data, fourth-order correction data, and fifth-order correction data, respectively.

The temperature compensation circuit 15 performs the temperature compensation based on the zeroth-order correction data to the fifth-order correction data. The temperature compensation based on the second-order correction data or the fourth-order correction data may be omitted. Further, any degree of the polynomial approximation can be used, and for example, a third-order polynomial approximation may be performed, or a polynomial approximation having a degree larger than the fifth-order may be performed. Further, the temperature sensor 16 may perform the zeroth-order correction. Further, the temperature compensation circuit 15 may perform the temperature compensation based on a temperature detection signal such as a temperature detection voltage input from the outside without providing the temperature sensor 16 in the integrated circuit 10.

The temperature compensation circuit 15 may perform a digital type temperature compensation. In this case, the temperature compensation circuit 15 is implemented by, for example, a logic circuit. Specifically, the temperature compensation circuit 15 performs a digital temperature compensation process based on the temperature detection data which is temperature detection information of the temperature sensor 16. For example, the temperature compensation circuit 15 obtains frequency adjustment data based on the temperature detection data. Further, by adjusting the capacitance value of the variable capacitance circuit of the oscillation circuit 11 based on the obtained frequency adjustment data, the temperature compensation process of the oscillation frequency of the oscillation circuit 11 is implemented. In this case, the variable capacitance circuit of the oscillation circuit 11 is implemented by a capacitor array having a plurality of binary weighted capacitors and a switch array. Further, the storage portion 17 stores a look up table representing the correspondence between the temperature detection data and the frequency adjustment data, and the temperature compensation circuit 15 uses the look up table, which is read from the storage portion 17 by the control circuit 13, to perform the temperature compensation process for obtaining the frequency adjustment data from the temperature data.

When the digital type temperature compensation process is performed, the temperature sensor 16 measures the temperature such as an ambient temperature and outputs the result as temperature detection data. The temperature detection data is data that is monotonously increased or monotonously decreased with respect to the temperature, for example. As the temperature sensor 16 in this case, one that utilizes the fact that an oscillation frequency of a ring oscillator has a temperature dependency can be used. Specifically, the temperature sensor 16 includes the ring oscillator and a counter circuit. In a count period, which is defined by a clock signal based on the oscillation signal OSC from the oscillation circuit 11, the counter circuit counts an output pulse signal, which is an oscillation signal of the ring oscillator, and outputs the count value as the temperature detection data.

The control circuit 13 controls the temperature compensation circuit 15. Further, the control circuit 13 can also control the oscillation circuit 11, the output circuit 12, the regulator circuit 14B, or the storage portion 17. For example, the control circuit 13 has a register, and when a normal operation of outputting the clock signal CK by oscillating the vibrating element 5 is started, the information, which is stored in the storage portion 17, is read, transferred to the register of the control circuit 13 and stored. Thereafter, based on the information stored in the register, various control signals are generated, the generated control signals are output to each circuit of the integrated circuit 10, and each circuit is controlled.

Therefore, since it is not necessary for the control circuit 13 to perform high-speed operation during normal operation, the noise generated by the control circuit 13 becomes low. The integrated circuit 10 may have a first mode in which the temperature compensation is turned on and a second mode in which the temperature compensation is turned off. In this case, the control circuit 13 can perform switching control between the first mode and the second mode.

The reference voltage generation circuit 14A generates a reference voltage VREF based on a power supply voltage VDD.

For example, the reference voltage VREF that becomes a constant voltage is generated even when there is the power supply voltage fluctuation or the temperature fluctuation. The reference voltage generation circuit 14A can be implemented by, for example, a bandgap reference circuit or the like that generates the reference voltage VREF based on a bandgap voltage.

The regulator circuit 14B generates a regulated power supply voltage based on the power supply voltage VDD. For example, the regulator circuit 14B generates the regulated power supply voltage based on the power supply voltage VDD from the terminal TVDD and the reference voltage VREF from the reference voltage generation circuit 14A.

By using the reference voltage VREF that becomes a constant voltage even when there is the power supply voltage fluctuation or the temperature fluctuation, the regulated power supply voltage that is a step-down voltage of the power supply voltage VDD and becomes a constant voltage even when there is the power supply voltage fluctuation or the temperature fluctuation can be generated. The regulator circuit 14B supplies the generated regulated power supply voltage to each circuit block of the integrated circuit 10. In this case, the regulator circuit 14B supplies the appropriate regulated power supply voltage corresponding to each circuit block such that, for example, the voltage values of the regulated voltage, which is supplied to the temperature compensation circuit 15, and the regulated voltage, which is supplied to the control circuit 13, are made different.

An output enable signal OE is input to a terminal TOE. The terminal TOE is electrically coupled to an external terminal TE7 of the vibrator device 1. The control circuit 13 performs a process of an output enable control based on the output enable signal OE input from the terminal TOE. In a test mode, a signal for testing the vibrating element 5 may be input via the terminal TOE. In this case, a switch circuit for coupling the terminal TOE and the wiring LA is provided, and a signal for testing input from the terminal TOE is input to one end of the vibrating element 5 via the switch circuit and the wiring LA. As a result, it is possible to test and inspect an overdrive and the like of the vibrating element 5.

Further, in a case where the storage portion 17 is implemented by the non-volatile memory, when information is written to the non-volatile memory, a high voltage for writing to the memory may be input via the terminal TOE and supplied to the non-volatile memory which is the storage portion 17.

The storage portion 17 is a circuit that stores various types of information, and can be implemented by a semiconductor memory or the like. Specifically, the storage portion 17 can be implemented by the non-volatile memory. As the non-volatile memory, an electrically erasable programmable read-only memory (EEPROM) capable of electrical erasure of data, or a one time programmable (OTP) memory or the like using a floating gate avalanche injection MOS (FAMOS) or the like can be used, for example. Alternatively, the non-volatile memory may be a memory using a fuse cell. When the temperature compensation circuit 15 performs the temperature compensation by polynomial approximation, the storage portion 17 implemented by the non-volatile memory or the like stores coefficient information of the polynomial approximation. For example, the storage portion 17 stores the above-mentioned zeroth-order correction data, first-order correction data, and high-order correction data as the coefficient information for polynomial approximation. Such coefficient information is written and stored in a storage portion 17 implemented by the non-volatile memory or the like at the time of manufacture or shipment of the integrated circuit 10 or the vibrator device 1, for example.

As a result, the coefficient information for the temperature compensation can be set according to the model of the integrated circuit 10 and the vibrator device 1.

Next, a method of manufacturing the vibrator device 1 of the present embodiment will be described. Regarding the vibrator device 1, although a flow is not illustrated, manufacturing can be implemented by using the following method, for example. First, a wafer-shaped semiconductor substrate 20 having a standard thickness is prepared. The standard thickness is specifically 625 to 775 µm. As a result, the semiconductor substrate 20 can be stably handled in the manufacturing process of the integrated circuit 10. Thereafter, the integrated circuit 10 is formed on the second surface 22 which is the lower surface. The thickness of the integrated circuit 10 is 5 to 20 µm. The redisposition wiring layer 8, which has the insulation layer 80 and the wiring 82, and the external coupling terminals 91 and 92 are formed on the second surface 22, and the contact pads 38, 39, and the like of the integrated circuit 10 and the external coupling terminals 91, 92, and the like are electrically coupled to each other. The thickness of the redisposition wiring layer 8 is 10 to 20 µm. Thereafter, a side of the first surface 21 of the semiconductor substrate 20, which is a side on which the vibrating element 5 is mounted, is ground with a back grinder or the like. That is, the thickness of the base 2 is reduced to a predetermined thickness. The predetermined thickness is a thickness at which a through hole described later can be formed by a dry etching, and is specifically 20 µm to 100 µm. Thereafter, the desired region of the base 2 is removed from the side of the first surface 21 by the dry etching. Further, a wet etching is performed to remove a desired region of an element separation film 25. As a result, the through hole is formed that passes through from the first surface 21 to the metal layer 31 of the wiring layer 30. Thereafter, the insulation layer 44, which is an insulation film, is formed on the surface of the semiconductor substrate 20, particularly on the inner surface of the through hole, and the through electrodes 40 and 41 are further formed by filling the inside of the through hole with a conductive material such as copper. Thereafter, the vibrating element 5 is prepared, and the vibrating element 5 is joined to the first surface 21 of the semiconductor substrate 20 via the joining members 60 and 61. Thereafter, a wafer having the same size as the semiconductor substrate 20 on which the lid 7 is formed is prepared. In a depressurization environment, the wafer including the base 2 and the wafer including the lid 7 are joined via the joining members 71 and 72. Thereafter, the vibrator device 1 is separated by dicing the joined wafer with a dicing saw or the like. As a result, the vibrator device 1 having the vibrating element 5 and the integrated circuit 10 is collectively manufactured by a batch process at a wafer level, so that the vibrator device 1 can be manufactured with high throughput and low cost. That is, the vibrator device 1 of the present embodiment is a wafer level package (WLP).

The above description is an example of a configuration of the vibrator device 1 that forms the integrated circuit 10 on the second surface 22, but the present embodiment is not limited to this, and various modifications can be performed.

Figure 5:
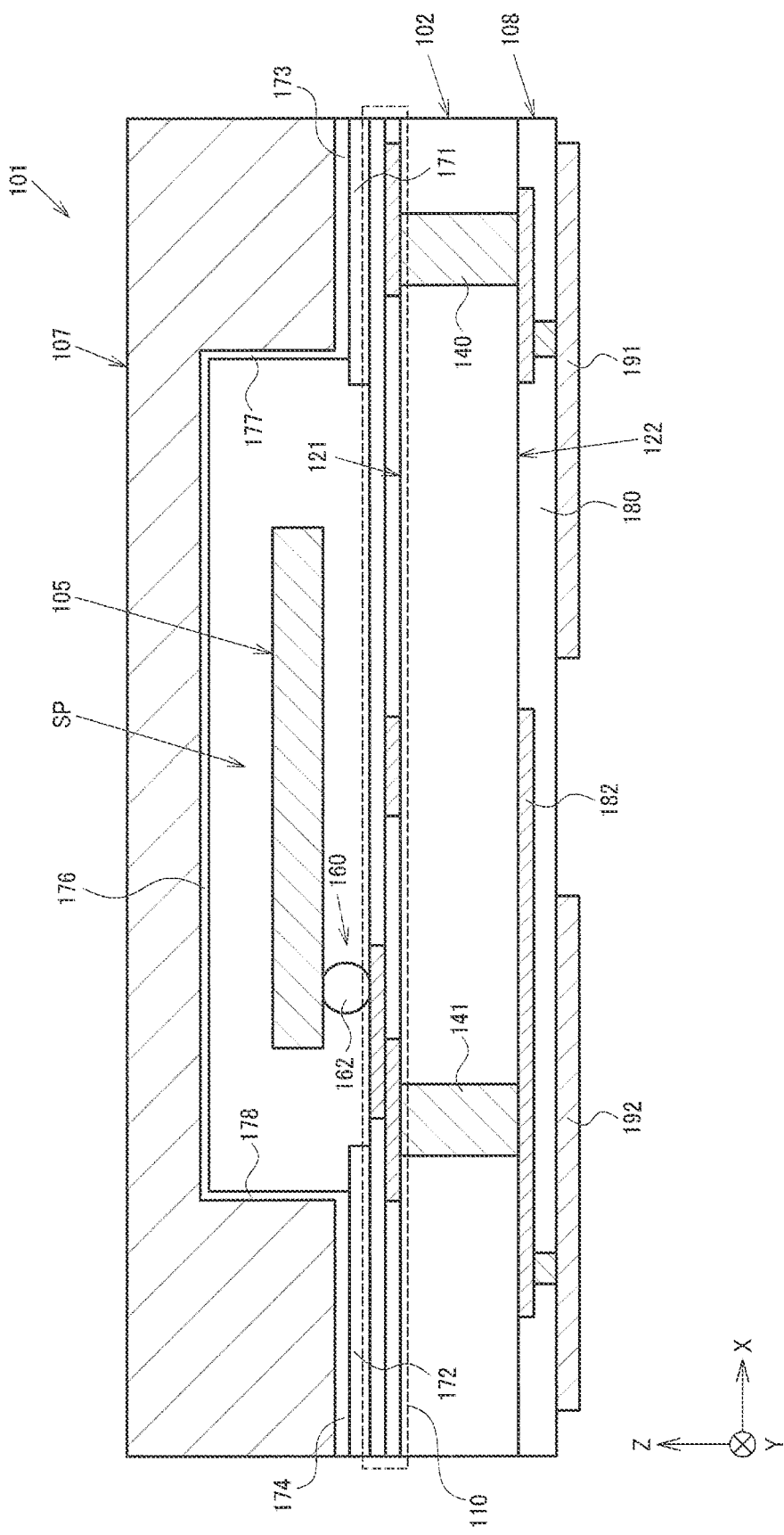
FIG. 5 is a cross-sectional view illustrating an example of a configuration of another vibrator device of the present embodiment.

For example, as illustrated in FIG. 5, a vibrator device 101, which forms an integrated circuit 110 on a first surface 121, may be used.

The vibrator device 101 includes a base 102, a vibrating element 105, and external coupling terminals 191 and 192. Further, the vibrator device 101 can include a redisposition wiring layer 108. The base 102 includes through electrodes 140 and 141. The vibrating element 105 is disposed on the first surface 121 side. For example, the vibrating element 105 is disposed at a position separated from the first surface 121 by a predetermined given separation distance. The vibrating element 105 is fixed to the first surface 121 via, for example, a joining member 160 having conductivity. The external coupling terminals 191 and 192 are provided on the second surface 122 side via an insulation layer 180, wiring 182, or the like. The insulation layer 180 is an insulation layer constituting the redisposition wiring layer 108. These can be formed by appropriately using the above-mentioned method.

The vibrator device 101 can also include a lid 107. Third metal layers 171 and 172 are provided on the first surface 121. The third metal layers 171 and 172 are, for example, gold having a thickness of 100 nm, but may be a metal such as copper. Fourth metal layers 173 and 174 are provided on a surface of the lid 107 that is in contact with the third metal layers 171 and 172. The fourth metal layers 173 and 174 are, for example, gold having a thickness of 20 nm, but may be a metal such as copper. The lid 107 and the first surface 121 are joined by joining the third metal layers 171 and 172 and the fourth metal layers 173 and 174 by activation joining. The activation joining is a method of performing a joining by contacting the third metal layers 171 and 172 and the fourth metal layers 173 and 174 with each other after activating the surfaces of the third metal layers 171 and 172, and the fourth metal layers 173 and 174 by irradiating the third metal layers 171 and 172 and the fourth metal layers 173 and 174 with a neutral argon ion beam or the like. As a result, the third metal layers 171 and 172 and the fourth metal layers 173 and 174 can be joined at a room temperature without requiring pressurization. Further, a fifth metal layer 176 may be further formed on a bottom surface of a recess portion of the lid 107. Further, sixth metal layers 177 and 178 may be further formed on a side surface of the recess portion of the lid 107. The fifth metal layer 176 and the sixth metal layers 177 and 178 are, for example, gold having a thickness of 20 nm, but may be a metal such as copper. As a result, the fifth metal layer 176 and the sixth metal layers 177 and 178 can protect the integrated circuit 110 or the vibrating element 105 from disturbances such as unnecessary radiation as a shielding layer. Further, by setting the thickness of the fifth metal layer 176 and the sixth metal layers 177 and 178 to substantially 20 nm, infrared rays can be transmitted. As a result, for example, by using silicon as the material of the lid 107, the vibrating element 105 inside the vibrator device 101 can be inspected using infrared rays. Although not illustrated, an adhesion layer such as titanium may be formed between the third metal layers 171 and 172, the fourth metal layers 173 and 174, the fifth metal layer 176 and the sixth metal layers 177 and 178, and the lid 107.

From the above, the vibrator device 1 of the present embodiment includes the semiconductor substrate 20, the base 2, the vibrating element 5, and the lid 7. The semiconductor substrate 20 has the first surface 21 and the second surface 22 which is in a front-back relationship with the first surface 21. The base 2 includes the integrated circuit 10 disposed on the first surface 21 or the second surface 22. The vibrating element 5 is electrically coupled to the integrated circuit 10 and is disposed on the first surface 21 side. The lid 7 is joined to the base 2 at the joining portion JA of the base 2 so as to accommodate the vibrating element 5. The fact that the integrated circuit 10 is disposed on the first surface 21 or the second surface 22 includes that the integrated circuit 10 is disposed on both the first surface 21 and the second surface 22.

A WLP such as the vibrator device 1 of the present embodiment has the following specific problems.

Figure 6:
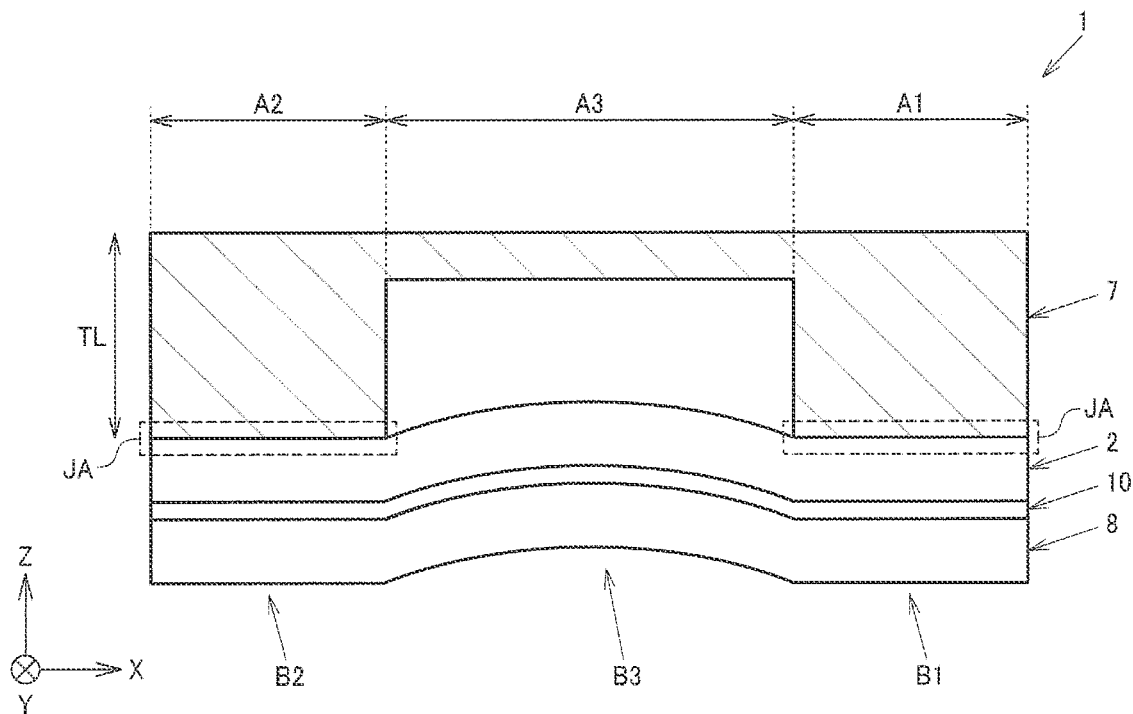
FIG. 6 is a view describing effect of stress applied on a vibrator device.

FIG. 6 schematically illustrates the effect of stress generated on the vibrator device 1 of the present embodiment. In FIG. 6, for convenience, the vibrating element 5 or the external coupling terminals 91 and 92 are not illustrated. Since each material that constitutes the device has a different thermal expansion coefficient, stress is applied by performing packaging. For example, the thermal expansion coefficient of silicon, which is the material of the base 2, is substantially 3 ppm/K, while the thermal expansion coefficient of copper, which is the wiring material, is substantially 17 ppm/K. Therefore, in the manufacturing process, the amount of heat shrinkage of the integrated circuit 10 and the redisposition wiring layer 8 is larger than the amount of heat shrinkage of the base 2, so that the stress that is based on the difference in the amount of heat shrinkage is generated. At this time, when the thickness of the base 2 is the above-mentioned standard thickness, since it is sufficiently thicker than the thickness of the integrated circuit 10 and the redisposition wiring layer 8, the base 2 is not deformed and flatness is maintained even when stress is applied. However, as described above, since the base 2 is thinned to 20 µm to 100 µm in the manufacturing process, the rigidity of the base 2 is lost and the effect of the stress cannot be ignored. Specifically, as illustrated in B3, the base 2, the integrated circuit 10, and the redisposition wiring layer 8 cannot maintain flatness and become warped. As a result, the distortion is generated on the passive element or the active element constituting the integrated circuit 10 and gives an effect to the characteristics of the passive element or the active element, and details will be described later in FIGS. 7, 8, and 9. Such a problem can also occur when the package is solder-mounted on an external circuit substrate or when the package and the circuit substrate are fixed with an underfill agent. On the other hand, the region indicated by A1 or A2 in FIG. 6 is a region in which the lid 7 is joined, that is, a region including the joining portion JA. When it is assumed that both the base 2 and the lid 7 are made of silicon, since the thermal expansion coefficients are the same as each other, in the region indicated by A1 or A2, the thickness obtained by adding the thickness TL of the lid to the thickness of the base 2 is substantially the thickness of the base 2. That is, the region indicated by A1 or A2 is equivalent to the fact that the integrated circuit 10 and the redisposition wiring layer 8 being formed on the base 2 having higher rigidity as compared with the region indicated by A3. Therefore, the region indicated by A1 or A2, that is, the region including the joining portion JA is flat or has little warpage as illustrated in B1 or B2.

Figure 7:
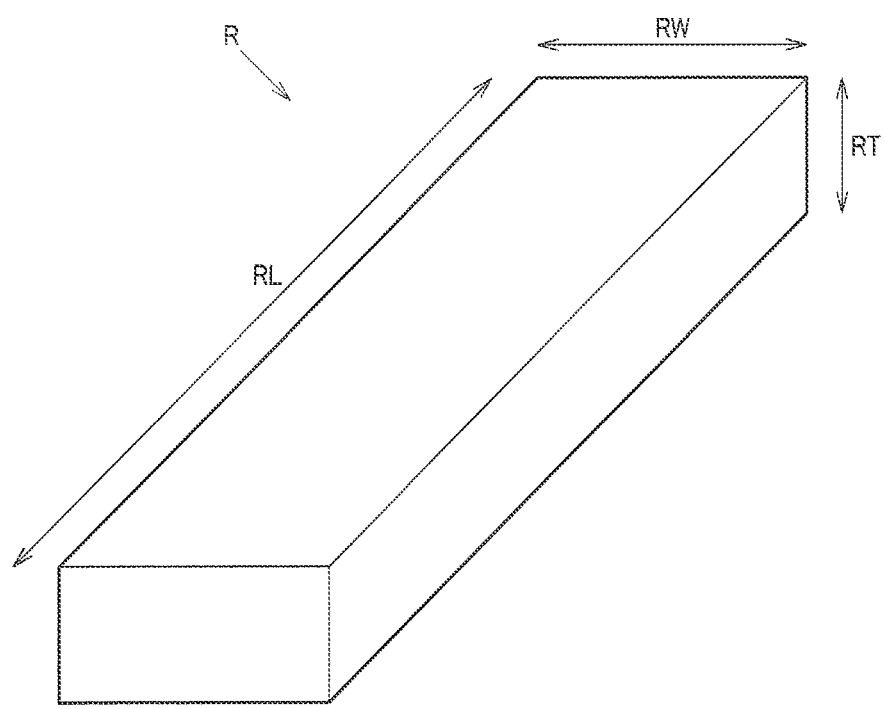
FIG. 7 is a view illustrating an example of a configuration of a resistor.

FIG. 7 schematically illustrates a structure of a resistor R of the present embodiment. When it is assumed that the resistor R is a rectangular parallelepiped having a length RL, a width RW, and a thickness RT, a resistance value of the resistor R is $(\Sigma \times RL)/(RW \times RT)$. Wherein, $\rho$ is the resistivity. Due to the effect of the stress described above, the resistor R is deformed into the rectangular parallelepiped having the length $(RL+\Delta RL)$, the width $(RW+\Delta RW)$, and the thickness $(RT+\Delta RT)$, so that the resistance value of the resistor R changes. The specific effect on the integrated circuit 10 due to the change in resistance value of the resistor R will be described later.

Figure 8:
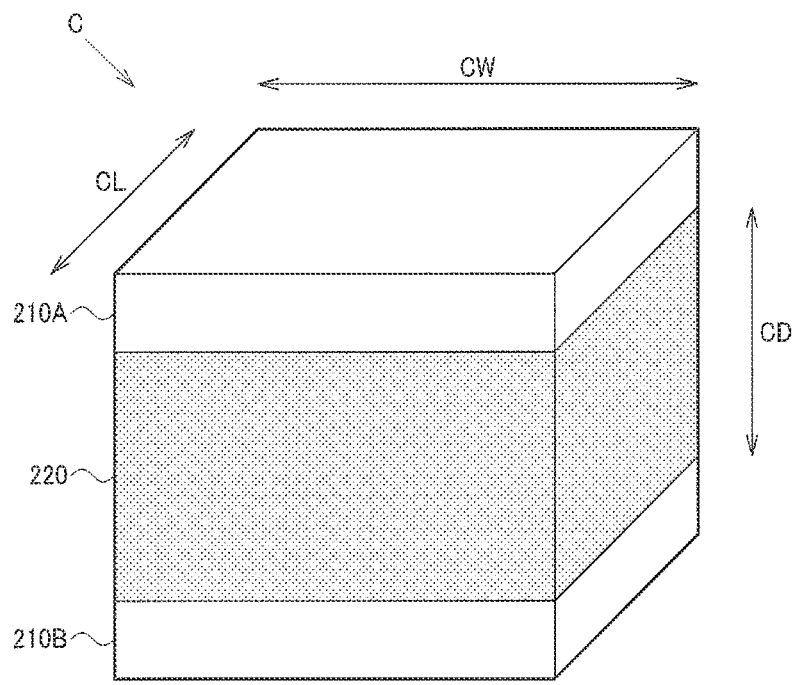
FIG. 8 is a view illustrating an example of a configuration of a capacitor.

FIG. 8 schematically illustrates an example of a structure of a capacitor C of the present embodiment. The capacitor C includes conductive layers 210A and 210B, and an insulation layer 220 between the conductive layers 210A and 210B. When it is assumed that the length and width of the conductive layers 210A and 210B are CL and CW, respectively, and the thickness of the insulation layer 220 is CD, the electrostatic capacitance of the capacitor C is $(\varepsilon \times CL \times CW)/CD$. Wherein, $\varepsilon$ is the permittivity. Due to the effect of the stress described above, the length of the conductive layers 210A and 210B changes to $(CL+\Delta CL)$, and the width changes to $(CW+\Delta CW)$. Further, the thickness of the insulation layer 220 changes to $(CD+\Delta CD)$. Therefore, the electrostatic capacitance of the capacitor C changes. The effect on the specific circuit due to the change in electrostatic capacitance of the capacitor C will be described later.

Figure 9:
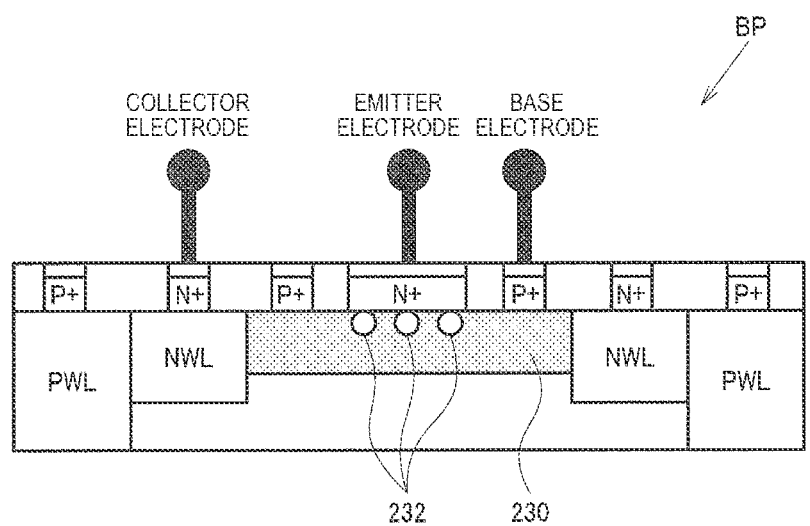
FIG. 9 is a cross-sectional view illustrating an example of a configuration of a bipolar transistor.

FIG. 9 schematically illustrates an example of a structure of the bipolar transistor BP of the present embodiment. When the stress is applied to the bipolar transistor BP, crystal defect 232 occurs in a base region 230 of the bipolar transistor BP. As a result, a leak recombination current increases, and the characteristics of the bipolar transistor BP change.

FIG. 10 is a plan view illustrating an example of a disposition of the through electrodes 40 and 41, the terminals TCK, TGND, TOE, TVC, TVDD, TXA, and TXB, and the integrated circuit 10 in the vibrator device 1 of the present embodiment. FIG. 10 illustrates a relationship between a position of the disposition of each circuit of the integrated circuit 10 and a position of the disposition of the through electrodes 40 and 41, and the terminals TCK, TGND, TOE, TVC, TVDD, TXA, and TXB. FIG. 10 is a plan view of the base 2 viewed from the minus side in the Z axis direction, and the outer shapes of the through electrodes 40 and 41 positioned on the plus side in the Z axis direction with respect to the base 2 on which the integrated circuit 10 is formed are indicated by dotted lines. Further, a lid inner wall line 9L indicating a position of an inner wall portion 9 of the lid 7 is indicated by a dotted line. That is, the region between the lid inner wall line 9L and a base outer peripheral line 2L corresponds to the joining portion JA described above.

Further, in FIG. 10, the region surrounded by a product region line 3L is a product region, and a region between the product region line 3L and the base outer peripheral line 2L indicating the outer peripheral of the base 2 is a scribe region. The scribe region is a region for disposing an accessory pattern and is also a cutting region for separating the wafer into individual vibrator devices 1. The accessory pattern is a pattern configured with an evaluation element for checking the electrical characteristics of an element, an electrode pad for supplying electric power to the evaluation element, or the like.

A guard ring 27 is formed in the vicinity of the edge of the product region so as to surround the integrated circuit 10. The guard ring 27 is formed, for example, by forming and contacting dummy metals in each of the layers of the metal layers 31 and 32 or the insulation layers 33 and 34 constituting the wiring layer 30 in FIG. 2, and prevents the intrusion of moisture and the like from the outside world. As a result, the entire integrated circuit 10 can be protected. The number of guard rings 27 is not limited to two as illustrated in FIG. 10 and may be one or three or more.

Further, in the present embodiment, as illustrated in FIG. 10, the base 2 has a first side SD1 and a second side SD2 that faces the first side SD1. That is, the integrated circuit 10 has the first side SD1 and the second side SD2 that faces the first side SD1. Further, the base 2 has a third side SD3 and a fourth side SD4 that faces the third side SD3. For example, the base 2 has a rectangular shape having the first side SD1, the second side SD2, the third side SD3, and the fourth side SD4 in a plan view. The rectangular shape does not have to be a strict rectangular shape and may be, for example, a shape in which the corner portion is chamfered.

As described above, the vibrator device 1 of the present embodiment includes the semiconductor substrate 20, a base 2 including the through electrode 40 that passes through between the first surface 21 and the second surface 22 of the semiconductor substrate 20, and the vibrating element 5 disposed on the first surface 21 side of the semiconductor substrate 20. As illustrated in FIG. 10, in the second surface 22 of the semiconductor substrate 20, the oscillation circuit 11 that is electrically coupled to the vibrating element 5 via the through electrodes 40, 41 and generates an oscillation signal OSC by oscillating the vibrating element 5 and the output circuit 12 that outputs a clock signal CK based on the oscillation signal OSC are disposed. For example, the oscillation signal OSC is generated by the oscillation circuit 11 to oscillate the vibrating element 5, and this oscillation signal OSC is buffered by the output circuit 12 and output as the clock signal CK. Further, the clock signal CK from the output circuit 12 is output from the external coupling terminal 91. That is, the clock signal CK from the output circuit 12 in FIG. 4 is output from the terminal TCK implemented by the contact pad 38.

In the vibrator device 1 of the present embodiment, the integrated circuit 10 includes the passive element, and the passive element is disposed such that at least a part of the passive element overlaps with the joining portion JA in a plan view from a direction orthogonal to the first surface 21. Details will be described later in FIGS. 11, 12, 13, 14, 16, and the like, and the oscillation circuit 11, the reference voltage generation circuit 14A, the regulator circuit 14B, the temperature compensation circuit 15, and the temperature sensor 16 include resistors or capacitors, which are the passive elements. As described above in FIG. 6, the effect of the stress in the region that does not overlap with the joining portion JA is large. That is, when the passive element is present in the region that does not overlap with the joining portion JA, since the passive element is deformed due to the effect of the stress, the characteristics exhibited by the passive element deviate from the design characteristics. Thereby, the disposition of the oscillation circuit 11, the reference voltage generation circuit 14A, the regulator circuit 14B, the temperature compensation circuit 15, and the temperature sensor 16 in the region that does not overlap with the joining portion JA means that the disposition of a circuit including the passive element, so that it gives an effect to the characteristics of the vibrator device 1. In that respect, in the vibrator device 1 of the present embodiment, the oscillation circuit 11, the reference voltage generation circuit 14A, the regulator circuit 14B, the temperature compensation circuit 15, and the temperature sensor 16 are disposed so as to overlap with the joining portion JA. In this way, by disposing the passive element in the region overlapping with the joining portion JA, the passive element is disposed in the region where the effect of the stress is small so that the deformation of the passive element can be minimized. As a result, the characteristics of the passive element can be stabilized. As a result, the oscillation characteristics of the vibrator device 1 after performing the packaging can be stabilized.

The passive element of the present embodiment is at least one of the capacitance element and the resistance element. For example, the reference voltage generation circuit 14A in FIG. 12, which will be described later, includes resistors RD1 to RD3 which are the resistance elements. Further, for example, the regulator circuit 14B in FIG. 13, which will be described later, includes resistors RD1 to RD3, which are the resistance elements, and capacitors CA, which are the capacitance elements. In this way, it is possible to reduce the deformation of these resistors and capacitors. As a result, it is possible to reduce a change in capacitance of the capacitor or the resistance value of the resistor. As a result, it is possible to reduce a change in oscillation frequency of the vibrator device 1.

Further, the capacitance element of the present embodiment is at least one of a metal-insulator-metal (MIM) capacitor, a polysilicon-insulator-polysilicon (PIP) capacitor, and a metal-oxide-semiconductor (MOS) capacitor. In the vibrator device 1, a MIM capacitor or a PIP capacitor is used to obtain a larger capacitance. Further, in order to perform the temperature compensation on the oscillation frequency, the MOS capacitor is used as the variable capacitance element whose capacitance value changes according to the applied voltage. That is, these capacitors are commonly used in the vibrator device 1. By applying the method of the present embodiment described above and disposing these capacitors at positions where the effect of the stress is small, the deformation of these capacitors can be reduced. As a result, changes in capacitance of these capacitors can be reduced. As a result, it is possible to reduce a change in oscillation frequency of the vibrator device.

Further, in the present embodiment, the control circuit 13 or the storage portion 17 is disposed inside the lid inner wall line 9L in a plan view. That is, the integrated circuit 10 includes a predetermined circuit disposed in a region that does not overlap with the joining portion JA in a plan view, and the predetermined circuit includes at least one of the control circuit 13 and the storage portion 17 which is a memory circuit. For example, of the control circuit 13, where the signal is determined to a high level or a low level, the effect of stress is sufficiently small, so the contribution that gives an effect to the oscillation frequency of the vibrator device due to the stress is small. Therefore, the disposition of the control circuit 13 or the like at a position overlapping with the joining portion JA narrows the room for the disposition of the circuit having a large effect due to the stress at the position overlapping with the joining portion JA. Therefore, by disposing the control circuit 13 or the storage portion 17, which are less hindered by the effect due to the stress, at a position where the effect of the stress is large, it is possible to increase the room for disposing a circuit having a large effect of the stress at a position where the effect of the stress is small.

Further, in the present embodiment, as illustrated in FIG. 10, the oscillation circuit 11 is disposed at a position closer to the first side SD1 than the second side SD2 in a plan view. Specifically, the oscillation circuit 11 is disposed between the first side SD1 and the through electrodes 40 and 41 in a plan view. That is, the oscillation circuit 11 is disposed in a region between the first side SD1 and a line coupling the through electrode 40 and the through electrode 41. For example, the oscillation circuit 11 is disposed along the first side SD1 and disposed such that the longitudinal direction thereof is along the first side SD1. The oscillation circuit 11 is electrically coupled to the vibrating element 5 via the terminals TXA and TXB implemented by the wirings LA and LB and the contact pads 36 and 37, and oscillates the vibrating element 5. For example, a circuit element such as a transistor, a capacitor, or a resistor constituting the oscillation circuit 11 has a conductive layer such as a metal layer or a diffusion layer having an area in a plan view. Accordingly, by the capacitive coupling between the conductive layer and the external coupling terminal 91 in the oscillation circuit 11, the signal component of the clock signal CK output from the external coupling terminal 91 is transmitted to the oscillation circuit 11 as noise, and it may give a bad effect to the oscillation characteristics. In this regard, in the present embodiment, since the oscillation circuit 11 is disposed at a position close to the first side SD1 in the plan view, it is possible to increase a distance between the oscillation circuit 11 and the external coupling terminal 91 disposed at a position close to the second side SD2 in a plan view.

Therefore, since the capacitance of the capacitive coupling between the oscillation circuit 11 and the external coupling terminal 91 can be reduced, it is possible to reduce the occurrence of deterioration of the oscillation characteristics of the oscillation circuit 11.

Figure 11:
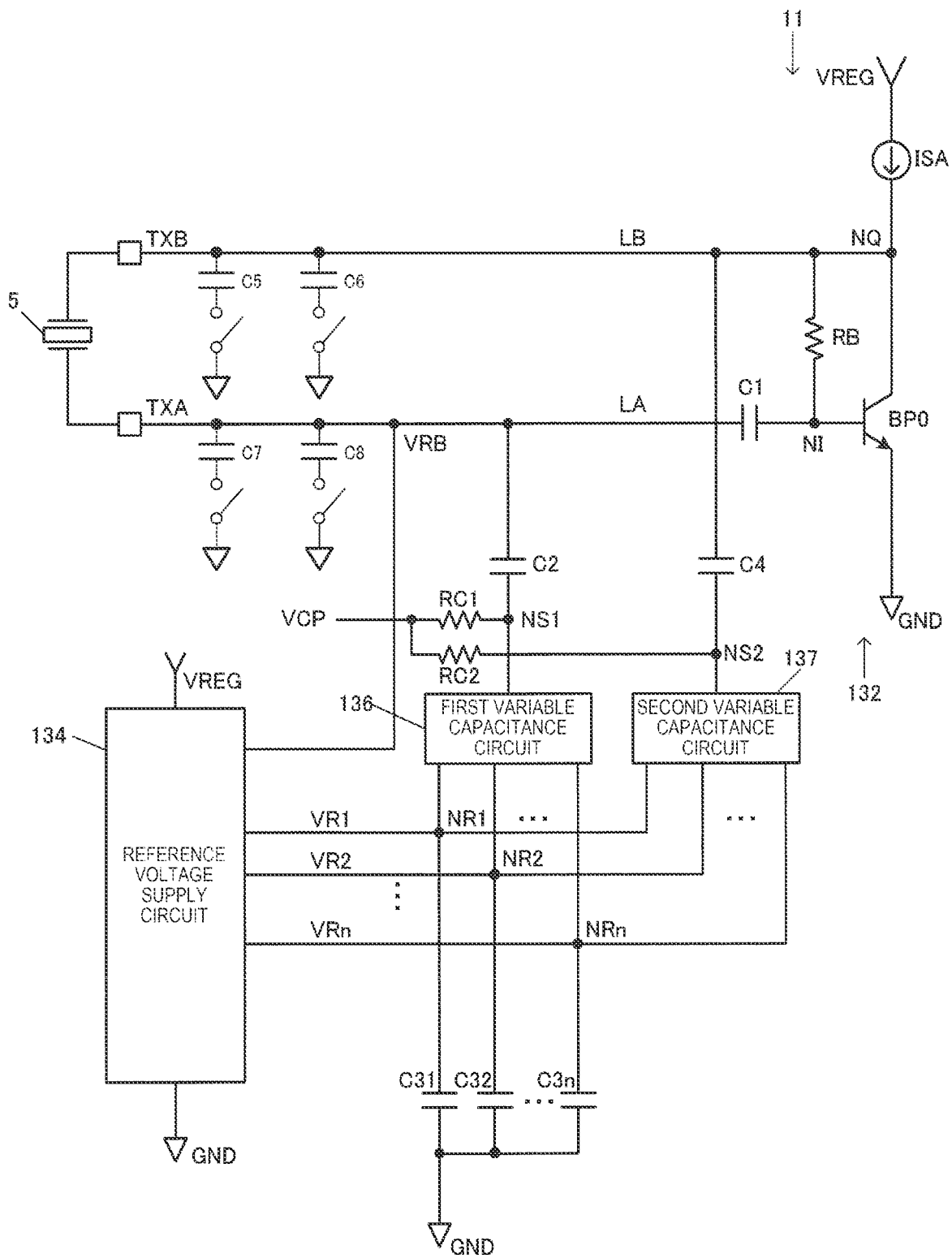
FIG. 11 is a view illustrating an example of a configuration of an oscillation circuit.

FIG. 11 illustrates an example of a configuration of the oscillation circuit 11. The oscillation circuit 11 includes a drive circuit 132, capacitors C1 and C2 for DC cut, a reference voltage supply circuit 134, and a first variable capacitance circuit 136. The oscillation circuit 11 can include a capacitor C4 for DC cut and a second variable capacitance circuit 137. The capacitor C4 and the second variable capacitance circuit 137 are not indispensable components. A modification can be possible without providing the capacitor C4 and the second variable capacitance circuit 137. Further, the capacitors C31 to C3$n$ are provided between a first variable capacitance circuit 136 and the second variable capacitance circuit 137, and a GND node.

The drive circuit 132 is a circuit that drives and oscillates the vibrating element 5. The drive circuit 132 includes a current source ISA, a bipolar transistor BP0, and a resistor RB. The current source ISA is provided between the power supply node of the regulated power supply voltage VREG and the bipolar transistor BP0, and supplies a constant current to the bipolar transistor BP0.

The bipolar transistor BP0 is a transistor that drives the vibrating element 5. A base node is an input node NI of the drive circuit 132, and a collector node is an output node NQ of the drive circuit 132. The resistor RB is provided between the collector node and the base node of the bipolar transistor BP0.

The capacitor C1 for DC cut is provided between the input node NI of the drive circuit 132 and the wiring LA. By providing such a capacitor C1, the DC component of the oscillation signal is cut, and only the AC component is transmitted to the input node NI of the drive circuit 132 so that the bipolar transistor BP0 can be properly operated. The capacitor C1 for DC cut may be provided between the output node NQ of the drive circuit 132 and the wiring LA.

The reference voltage supply circuit 134 supplies reference voltages VR1 to VRn to the first variable capacitance circuit 136 and the second variable capacitance circuit 137. The reference voltage supply circuit 134 includes a plurality of resistors provided in series between the regulated power supply voltage VREG node and the GND node and outputs voltages obtained by dividing the VREG voltage as the reference voltages VR1 to VRn, for example. Further, the reference voltage supply circuit 134 supplies a reference voltage VRB for bias voltage setting to the wiring LA. As a result, an amplitude center voltage of the oscillation signal in the wiring LA can be set to the reference voltage VRB. The amplitude center voltage of the oscillation signal in the wiring LB is set based on, for example, the base-emitter voltage of the bipolar transistor BP0 and the base current flowing through the resistor RB.

One end of the capacitor C2 for DC cut is electrically coupled to the wiring LA, and the other end thereof is electrically coupled to a supply node NS1 of the temperature compensated voltage VCP. The temperature compensated voltage VCP is supplied to the supply node NS1 via a resistor RC1. One end of the first variable capacitance circuit 136 is electrically coupled to the supply node NS1 and supplied with the temperature compensated voltage VCP. Further, the reference voltage supply circuit 134 supplies the reference voltages VR1 to VRn to supply nodes NR1 to NRn at the other end of the first variable capacitance circuit 136. The capacitors C31 to C3$n$ are provided between the supply nodes NR1 to NRn of the reference voltages VR1 to VRn, and the GND node. One end of the capacitor C4 for DC cut is electrically coupled to the wiring LB, and the other end thereof is electrically coupled to a supply node NS2 of the temperature compensated voltage VCP. The temperature compensated voltage VCP is supplied to the supply node NS2 via a resistor RC2. Further, a switch and capacitors C7 and C8 are provided between the wiring LA and the GND node, and the load capacitance of the wiring LA is adjusted. Further, a switch and capacitors C5 and C6 are provided between the wiring LB and the GND node, and the load capacitance of the wiring LB is adjusted. One end of the second variable capacitance circuit 137 is electrically coupled to the supply node NS2 and supplied with the temperature compensated voltage VCP. Further, the reference voltage supply circuit 134 supplies the reference voltages VR1 to VRn to the supply nodes NR1 to NRn at the other end of the second variable capacitance circuit 137. The first variable capacitance circuit 136 includes n variable capacitance elements. n is an integer of 2 or more. The n variable capacitance elements are, for example, MOS type variable capacitance elements, and are constituted by n transistors. The reference voltages VR1 to VRn are supplied to the gates of the n transistors. Further, the source and drain of each transistor among the n transistors are short-circuited, and the temperature compensated voltage VCP is supplied to the supply node NS1 to which the short-circuited source and drain are coupled. The capacitance of the capacitor C2 for DC cut is a capacitance sufficiently larger as compared with the capacitance of the first variable capacitance circuit 136. By using the first variable capacitance circuit 136 having such a configuration, in a wide range of voltage of the temperature compensated voltage VCP, the linearity of the capacitance change of the total capacitance of the first variable capacitance circuit 136 can be ensured. Since the configuration of the second variable capacitance circuit 137 is the same as that of the first variable capacitance circuit 136, a detailed description thereof will be omitted.

As described above, in the vibrator device 1 of the present embodiment, the integrated circuit 10 includes the oscillation circuit 11 that outputs the oscillation signal by oscillating the vibrating element 5, and the passive element is at least one of the capacitance element or the resistance element included in the oscillation circuit 11. As described above, when the resistor (not illustrated) included in the reference voltage supply circuit 134 is deformed by the stress and the resistance value becomes unstable, the reference voltages VR1 to VRn supplied from the reference voltage supply circuit 134 also become unstable. As a result, the voltage applied to the first variable capacitance circuit 136 also becomes unstable. Further, as described above in FIG. 8, the capacitances of the capacitors C1, C2, C31 to C3n, and C4 to C8 also become unstable due to the effect of the stress. As a result, the load capacitance of the oscillation circuit 11 becomes unstable, causing a problem that the frequency of the vibrator device 1 fluctuates. In this regard, when the method of the present embodiment is applied, by disposing the capacitance element or resistance element included in the oscillation circuit 11 at a position where the effect of the stress is small, the deformation of the capacitance element or the resistance element included in the oscillation circuit 11 can be reduced. As a result, it is possible to reduce a change in capacitance of the capacitance element or resistance value of the resistance element included in the oscillation circuit 11. As a result, it is possible to reduce a change in oscillation frequency of the vibrator device 1.

Figure 12:
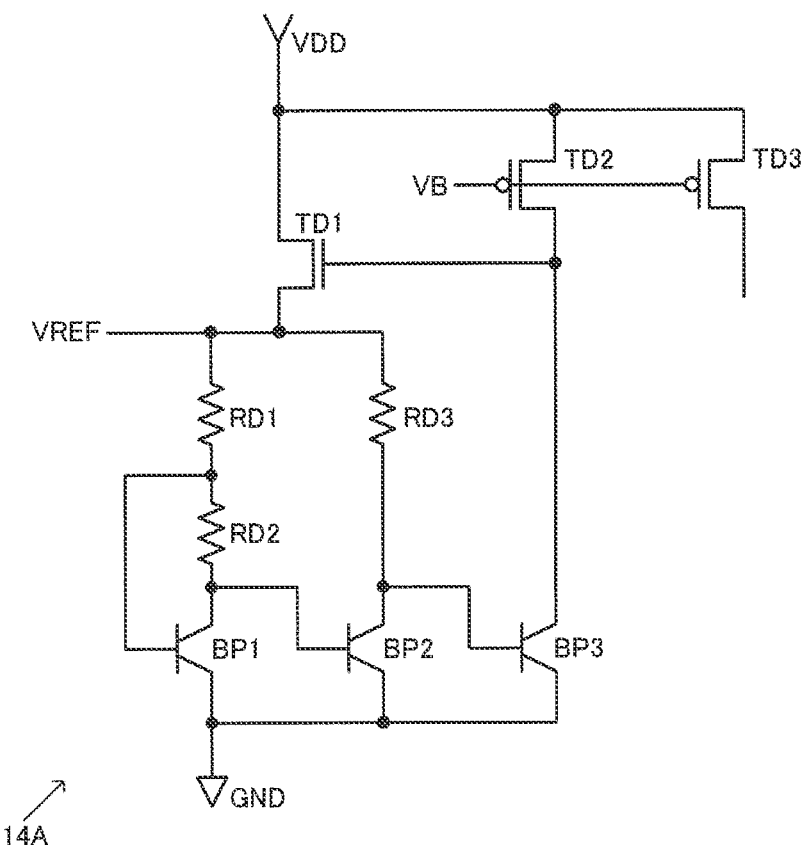
FIG. 12 is a cross-sectional view illustrating an example of a configuration of a reference voltage generation circuit.

FIG. 12 illustrates an example of a configuration of the reference voltage generation circuit 14A. The reference voltage generation circuit 14A includes N type transistors TD1, resistors RD1, RD2, and RD3, and bipolar transistors BP1 and BP2 provided between the VDD node and the GND node. Further, the reference voltage generation circuit 14A includes P type transistors TD1 and TD2 in which the bias voltage BS is input to the gate, and a bipolar transistor BP3 provided between the drain node and the GND node of the transistor TD2. The reference voltage generation circuit 14A is a bandgap reference circuit and generates and outputs the reference voltage VREF based on the bandgap voltage.

For example, it is assuming that the base-emitter voltages of the PNP type bipolar transistors BP1 and BP2 are VBE1 and VBE2, and $\Delta VBE=VBE1-VBE2$ is established. The reference voltage generation circuit 14A outputs the reference voltage VREF such that $VREF=K \times \Delta VBE+VBE2$, for example.

K is set by using the resistance values of the resistors RD1 and RD2. For example, since VBE2 has negative temperature characteristics and $\Delta VBE$ has a positive temperature characteristic, by adjusting the resistance values of the resistors RD1 and RD2, it is possible to generate a constant voltage reference voltage VREF with no temperature dependency. The generated reference voltage VREF becomes a constant voltage based on the ground voltage. The reference voltage generation circuit 14A is not limited to the configuration illustrated in FIG. 12, and circuits having various configurations such as a circuit that generates the reference voltage VREF using the work function difference voltage of the transistor can be used, for example.

As described above, in the vibrator device 1 of the present embodiment, the integrated circuit 10 includes the reference voltage generation circuit 14A that generates the reference voltage used in the integrated circuit 10, and the passive element is the resistance element included in the integrated circuit 10. As described above, when the resistors RD1, RD2, and RD3 included in the reference voltage generation circuit 14A are deformed due to the stress and the resistance value becomes unstable, the reference voltage VREF also becomes unstable. As a result, the regulated power supply voltage VREG output from the regulator circuit 14B, which will be described later, becomes unstable, and the load capacitance of the oscillation circuit 11 fluctuates. As a result, there arises a problem that the frequency of the vibrator device 1 fluctuates. In this regard, when the method of the present embodiment is applied, by disposing the resistance element included in the reference voltage generation circuit 14A at a position where the effect of the stress is small, the deformation of the resistance element included in the reference voltage generation circuit 14A can be reduced. As a result, the change in resistance value of the resistance element included in the reference voltage generation circuit 14A can be reduced, so that the reference voltage VREF or the regulated power supply voltage VREG can be stabilized. As a result, it is possible to reduce a change in oscillation frequency of the vibrator device 1.

Figure 13:
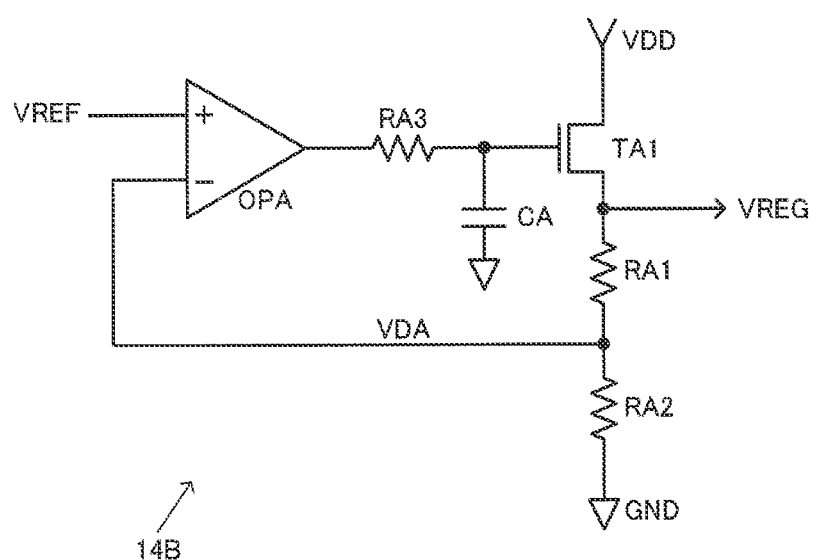
FIG. 13 is a view illustrating an example of a configuration of a regulator circuit.

FIG. 13 illustrates an example of a configuration of the regulator circuit 14B. The regulator circuit 14B includes the N type transistor TA1 for driving and resistors RA1 and RA2 provided in series between the VDD node and the GND node, and an operational amplifier OPA. Further, the regulator circuit 14B can include a resistor RA3 and a capacitor CA provided on the side of the output terminal of the operational amplifier OPA. The reference voltage VREF is input to a non-inverting input terminal of the operational amplifier OPA, and the voltage VDA that is obtained by dividing the regulated power supply voltage VREG1 by the resistors RA1 and RA2 is input to an inverting input terminal. The output terminal of the operational amplifier OPA is input to a gate of the transistor TA1 via the resistor RA3, and the regulated power supply voltage VREG is output from a drain node of the transistor TA1. The regulator circuit 14B outputs a fixed voltage regulated power supply voltage VREG by setting the resistors RA1 and RA2 as resistors with fixed resistance values, but the resistance values of the resistors RA1 and RA2 may be set variably. As a result, for example, the resistance value can be adjusted to compensate for fluctuations in the regulated power supply voltage VREG with respect to process fluctuations during manufacturing or shipping.

As described above, in the vibrator device 1 of the present embodiment, the integrated circuit 10 includes the regulator circuit 14B that generates the regulated power supply voltage VREG, and the passive element is the resistance element included in the regulator circuit 14B. As described above, when the resistors RA1 and RA2 included in the regulator circuit 14B are deformed due to the stress and the resistance value changes, the ratio of the resistor RA1 and the resistor RA2 fluctuates, and the regulated power supply voltage VREG fluctuates. As a result, the load capacitance of the oscillation circuit 11 fluctuates, causing a problem that the frequency of the vibrator device 1 fluctuates. In this regard, when the method of the present embodiment is applied, by disposing the resistance element included in the regulator circuit 14B at a position where the effect of the stress is small, the deformation of the resistance element included in the regulator circuit 14B can be reduced. As a result, changes in the resistance value of the resistance element included in the regulator circuit 14B can be suppressed, so that fluctuations in the regulated power supply voltage VREG can be suppressed. As a result, it is possible to reduce a change in oscillation frequency of the vibrator device 1.

Further, as described above, the vibrator device 1 of the present embodiment includes at least one of the reference voltage generation circuit 14A that generates the reference voltage used in the integrated circuit 10 and the regulator circuit 14B that generates the regulated power supply voltage VREG used in the integrated circuit 10. At least a part of the passive element or the active element included in at least one of the reference voltage generation circuit 14A and the regulator circuit 14B is disposed so as to overlap with the joining portion JA in a plan view from a direction orthogonal to the first surface 21. For example, the reference voltage generation circuit 14A includes the bipolar transistors BP1 to BP3 as active elements in addition to the passive element as described above. As described above in FIG. 9, when the bipolar transistors BP1 to BP3 are present in the region that does not overlap with the joining portion JA, the base current of the bipolar transistors BP1 to BP3 changes due to the effect of the stress. As a result, the reference voltage VREF becomes unstable, and the problem that the frequency of the vibrator device 1 changes occurs as described above. In this regard, when the method of the present embodiment is applied, for example, by disposing the resistors RD1 to RD3, which are passive elements, or the bipolar transistors BP1 to BP3, which are active elements, in the region overlapping with the joining portion JA, these characteristics can be stabilized. As a result, the oscillation characteristics of the vibrator device 1 after performing the packaging can be stabilized.

Figure 14:
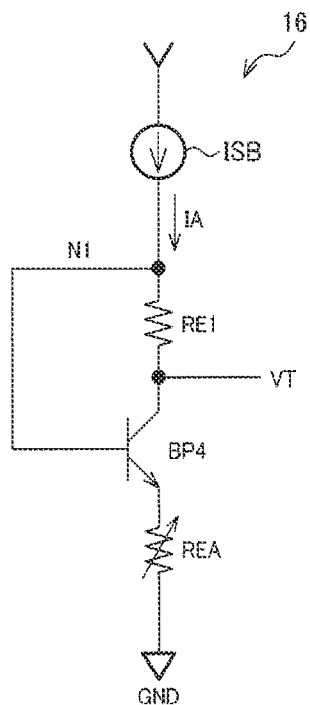
FIG. 14 is a view illustrating an example of a configuration of a temperature sensor.

FIG. 14 illustrates an example of a configuration of the temperature sensor 16. The temperature sensor 16 includes a bipolar transistor BP4, a resistor RE1, a variable resistance circuit REA, and a current source ISB. The current source ISB is provided between a power supply node NVD and a first node N1 and outputs a constant current IA to the first node N1. For example, the current source ISB is constituted by a resistor provided between the power supply node NVD and the GND node and a current mirror circuit that outputs the constant current IA by mirroring the current flowing through the resistor. The first node N1 is coupled to the base node of the bipolar transistor BP4. The resistor RE1 is provided between the first node N1 and the collector node of the bipolar transistor BP4. That is, one end of the resistor RE1 is coupled to the first node N1, and the other end of the resistor RE1 is coupled to the collector node of the bipolar transistor BP4. The variable resistance circuit REA is provided between the emitter node of the bipolar transistor BP4 and the GND node. That is, one end of the variable resistance circuit REA is coupled to the emitter node of the bipolar transistor BP4, and the other end of the variable resistance circuit REA is coupled to the GND node. Zeroth-order correction data is input from the storage portion 17 to the variable resistance circuit REA, and the resistance value of the variable resistance circuit REA is set by the zeroth-order correction data. As a result, the temperature detection voltage VT having the temperature dependency is output from the collector node of the bipolar transistor BP4.

As described above, in the vibrator device 1 of the present embodiment, the integrated circuit 10 includes the temperature sensor 16 that detects the temperature, and the passive element is the resistance element included in the temperature sensor 16.

As described above, when the resistor RE1 or the like included in the temperature sensor 16 is deformed due to the stress and the resistance value changes, the temperature detection voltage VT fluctuates. As a result, the load capacitance of the oscillation circuit 11 fluctuates, causing a problem that the frequency of the vibrator device 1 fluctuates. In this regard, when the method of the present embodiment is applied, by disposing the resistance element included in the temperature sensor 16 at a position where the effect of the stress is small, the deformation of the resistance element included in the temperature sensor 16 can be reduced. As a result, the change in resistance value of the resistance element included in the temperature sensor 16 can be reduced, so that the temperature detection voltage VT can be stabilized. As a result, it is possible to reduce a change in oscillation frequency of the vibrator device 1.

Figure 15:
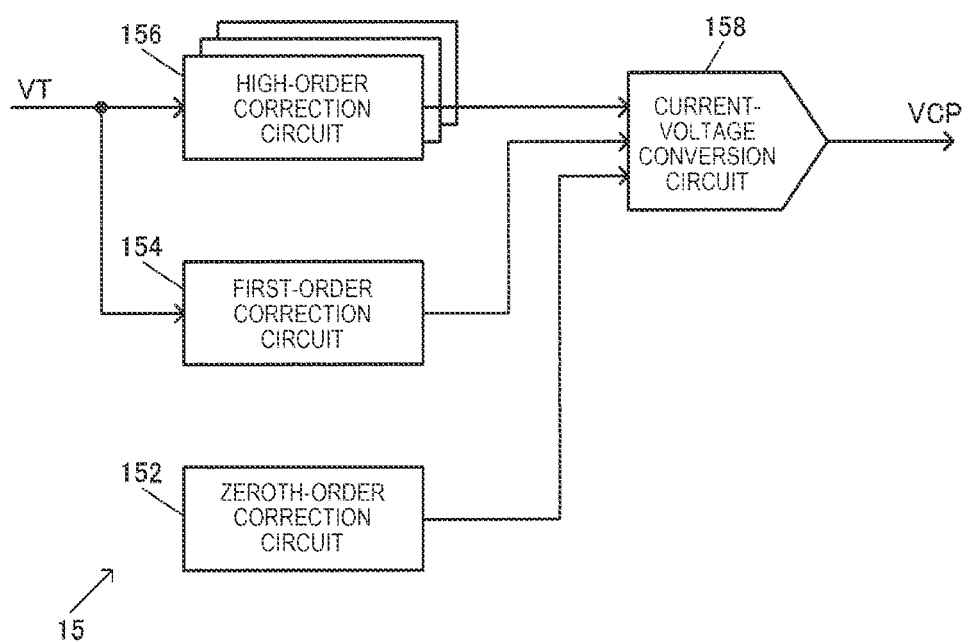
FIG. 15 is a view illustrating an example of a configuration of a temperature compensation circuit.

FIG. 15 illustrates an example of a configuration of the temperature compensation circuit 15. The temperature compensation circuit 15 includes a zeroth-order correction circuit 152, a first-order correction circuit 154, a high-order correction circuit 156, and a current-voltage conversion circuit 158.

For example, when the third-order correction, fourth-order correction, fifth-order correction, or the like is performed, a plurality of correction circuits such as a third-order correction circuit, a fourth-order correction circuit, and a fifth-order correction circuit are provided as the high-order correction circuit 156. The high-order correction circuit 156 is also referred to as a function generation circuit and generates a function current corresponding to a polynomial that approximates the characteristics of the temperature compensated voltage VCP. For example, a polynomial is a function whose variable is temperature.

The temperature compensation circuit 15 performs the analog type temperature compensation by polynomial approximation. Specifically, the temperature compensation circuit 15 generates and outputs the temperature compensated voltage VCP by approximating a polynomial which is a function having temperature as a variable. For this purpose, the storage portion 17 stores the zeroth-order coefficient, the first-order coefficient, and the high-order coefficient of the polynomial that approximates the characteristics of the temperature compensated voltage VCP as the zeroth-order correction data, the first-order correction data, and the high-order correction data. The zeroth-order correction circuit 152, the first-order correction circuit 154, and the high-order correction circuit 156 output a zeroth-order correction current signal, a first-order correction current signal, and a high-order correction current signal based on the zeroth-order correction data, the first-order correction data, and the high-order correction data stored in the storage portion 17. The zeroth-order correction current signal, the first-order correction current signal, and the high-order correction current signal can be said to be a zeroth-order component signal, a first-order component signal, and a high-order component signal of the function current. Thereafter, based on the temperature detection voltage VT that changes linearly with the temperature, the first-order correction current signal and the high-order correction current signal are generated and output to the first-order correction circuit 154 and the high-order correction circuit 156. The current-voltage conversion circuit 158 performs the adding process of the zeroth-order correction current signal, the first-order correction current signal, and the high-order correction current signal, performs the current-voltage conversion, and outputs the temperature compensated voltage VCP. As a result, the analog type temperature compensation by polynomial approximation is implemented. When the zeroth-order correction of the temperature compensation is performed by using the temperature sensor 16 as described above, the configuration of the zeroth-order correction circuit 152 can be omitted. In this case, in order to correct the deviation of the temperature detection voltage characteristics due to the fluctuation of the offset voltage of the temperature detection voltage VT, for example, the second-order correction circuit or the fourth-order correction circuit may be provided in the temperature compensation circuit 15 that performs the temperature compensation for the fifth-order polynomial approximation.

Figure 16:
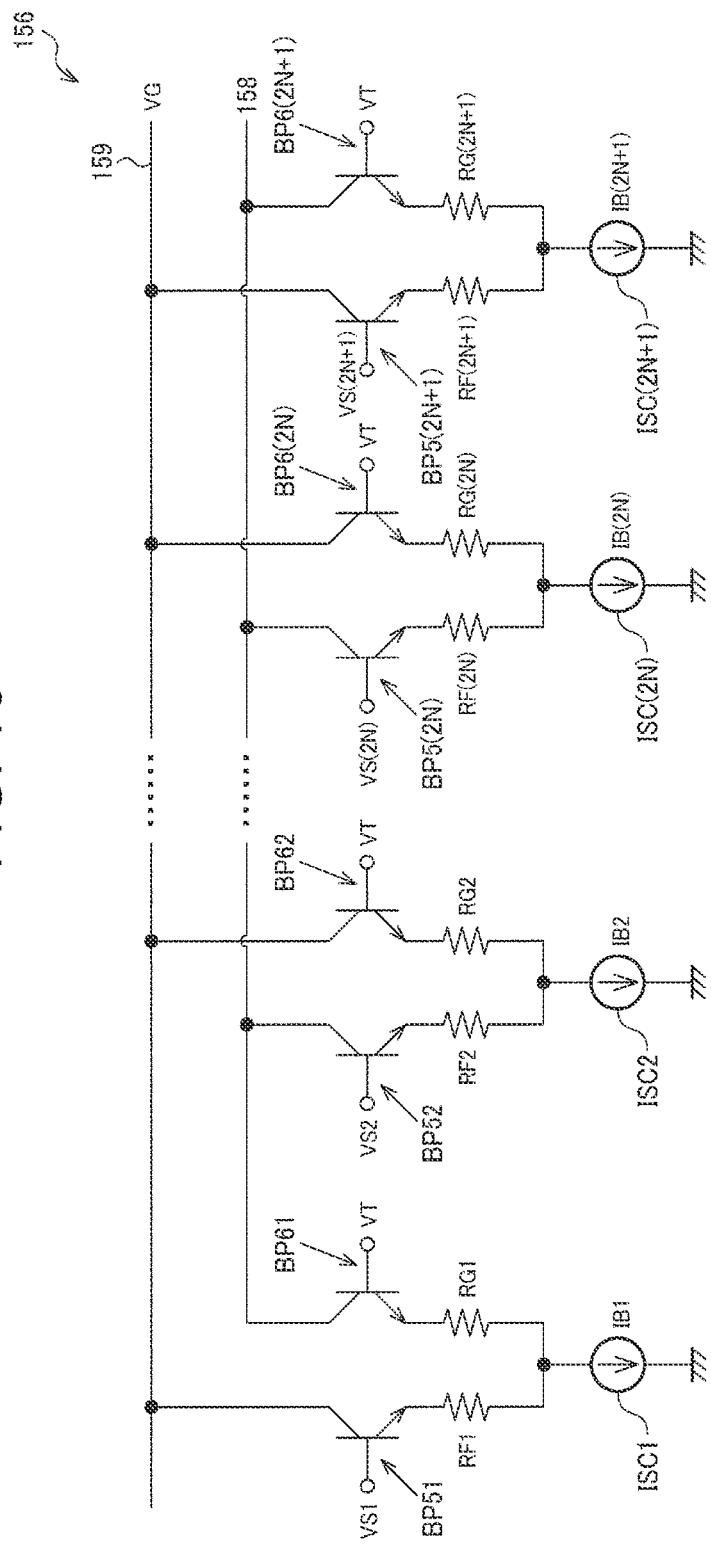
FIG. 16 is a view illustrating an example of a configuration of a high-order correction circuit.

FIG. 16 illustrates an example of a configuration of the high-order correction circuit 156. The high-order correction circuit 156 includes bipolar transistors BP51 to BP5(2N+1), bipolar transistors BP61 to BP6(2N+1), resistors RF1 to RF(2N+1), resistors RG1 to RG(2N+1), and current sources ISC1 to ISC(2N+1). N is a natural number. The reference voltages VS1 to VS(N+1) and the reference voltage VG, which will be described later, are output from a voltage generation circuit (not illustrated).

A differential pair is constituted by the bipolar transistor BP51 and the bipolar transistor BP61. In the bipolar transistor BP51, the reference voltage VS1 is input to the base terminal, the collector terminal is coupled to a reference voltage supply line 159 that supplies the reference voltage VG, and the emitter terminal is electrically coupled to the current source ISC1 via the resistor RF1.

In the bipolar transistor BP61, the temperature detection voltage VT is input to the base terminal, the collector terminal is electrically coupled to the current-voltage conversion circuit 158, and the emitter terminal is electrically coupled to the current source ISC1 via the resistor RG1. The current source ISC1 allows a constant current IB1 to flow through the differential pair constituted by the bipolar transistor BP51 and the bipolar transistor BP61 via the resistor RF1 and the resistor RG1. The same applies to the differential pair constituted by the bipolar transistor BP5(2N+1) and the bipolar transistor BP6(2N+1).

Further, the differential pair is constituted by the bipolar transistor BP52 and the bipolar transistor BP62. In the bipolar transistor BP52, the reference voltage VS2 is input to the base terminal, the collector terminal is electrically coupled to the current-voltage conversion circuit 158, and the emitter terminal is electrically coupled to the current source ISC2 via the resistor RG1. In the bipolar transistor BP62, the temperature detection voltage VT is input to the base terminal, the collector terminal is electrically coupled to the reference voltage supply line 159, and the emitter terminal is electrically coupled to the current source ISC2 via the resistor RG2. The current source ISC2 allows a constant current IB(2N) to flow through the differential pair constituted by the bipolar transistor BP52 and the bipolar transistor BP62 via the resistor RF2 and the resistor RG2. The same applies to the differential pair constituted by the bipolar transistor BP5(2N) and the bipolar transistor BP6(2N).

A value of the temperature detection voltage VT decreases substantially linearly with respect to the temperature T, and when it is assumed that the temperature T is T1, T2, . . . , T(2N), T(2N+1), the temperature coincides with the reference voltages VS1, VR2, . . . , VSN, VS(2N+1), respectively. It is assumed that T1<T2< . . . <T(2N)<T(2N+1). Although a detailed description of the known method is omitted, by including the differential pair of such a configuration, the current value from the current-voltage conversion circuit 158 monotonously decreases when the temperature T is in the vicinity of T1, for example, and monotonously increases when the temperature T is in the vicinity of T2, and thereafter, monotonous decrease and monotonous increase are repeated alternately according to the number of differential pairs. As a result, the temperature dependency of the current value from the current-voltage conversion circuit 158 indicates a pattern of repeating undulations, although not illustrated.

As described above, in the vibrator device 1 of the present embodiment, the integrated circuit 10 includes the temperature compensation circuit 15 that performs the temperature compensation of the oscillation frequency of the vibrating element 5, and the passive element is the resistance element included in the temperature compensation circuit 15. As described above, the high-order correction circuit 156 of the temperature compensation circuit 15 includes the resistors RF1 to RF(2N+1) and resistors RG1 to RG(2N+1) constituting each differential pair. When these resistors are deformed due to the stress and the resistance value changes, the current value on the wiring coupled to the current-voltage conversion circuit 158 fluctuates. As a result, the temperature compensated voltage VCP fluctuates, so that the load capacitance of the oscillation circuit 11 fluctuates, causing a problem that the frequency of the vibrator device 1 fluctuates. In this regard, when the method of the present embodiment is applied, by disposing the resistance element included in the temperature compensation circuit 15 at a position where the effect of the stress is small, the deformation of the resistance element included in the temperature compensation circuit 15 can be reduced. As a result, the change in resistance value of the resistance element included in the temperature compensation circuit 15 can be reduced, so that the temperature compensated voltage VCP can be stabilized. As a result, it is possible to reduce a change in oscillation frequency of the vibrator device 1.

Further, the vibrator device 1 of the present embodiment includes at least one of the temperature sensor 16 that detects the temperature and the temperature compensation circuit 15 that performs the temperature compensation of the oscillation frequency of the vibrating element 5. At least a part of the passive element or the active element included in at least one of the temperature sensor 16 and the temperature compensation circuit 15 is disposed so as to overlap with the joining portion 73 in a plan view from a direction orthogonal to the first surface 21. As described above in FIGS. 14 and 16, the temperature sensor 16 or the temperature compensation circuit 15 includes the active elements such as bipolar transistors BP4, BP51 to BP5(2N+1), and BP61 to BP6(2N+1) in addition to the above-mentioned passive elements. As described above in FIG. 9, when BP4, BP51 to BP5(2N+1) and BP61 to BP6(2N+1) are present in the region not overlapping with the joining portion JA, the base currents of the bipolar transistors BP4, BP51 to BP5(2N+1), and BP61 to BP6(2N+1) change due to the effect of the stress. The temperature compensated voltage VCP fluctuates, so that the load capacitance of the oscillation circuit 11 fluctuates, causing a problem that the frequency of the vibrator device 1 fluctuates. In that respect, in the vibrator device 1 of the present embodiment, the temperature sensor 16 and the temperature compensation circuit 15 are disposed so as to overlap with the joining portion JA. In this way, the characteristics of the passive element or the active element can be stabilized by disposing the passive element or the active element in the region overlapping with the joining portion JA. As a result, the oscillation characteristics of the vibrator device 1 after performing the packaging can be stabilized.

Figure 17:
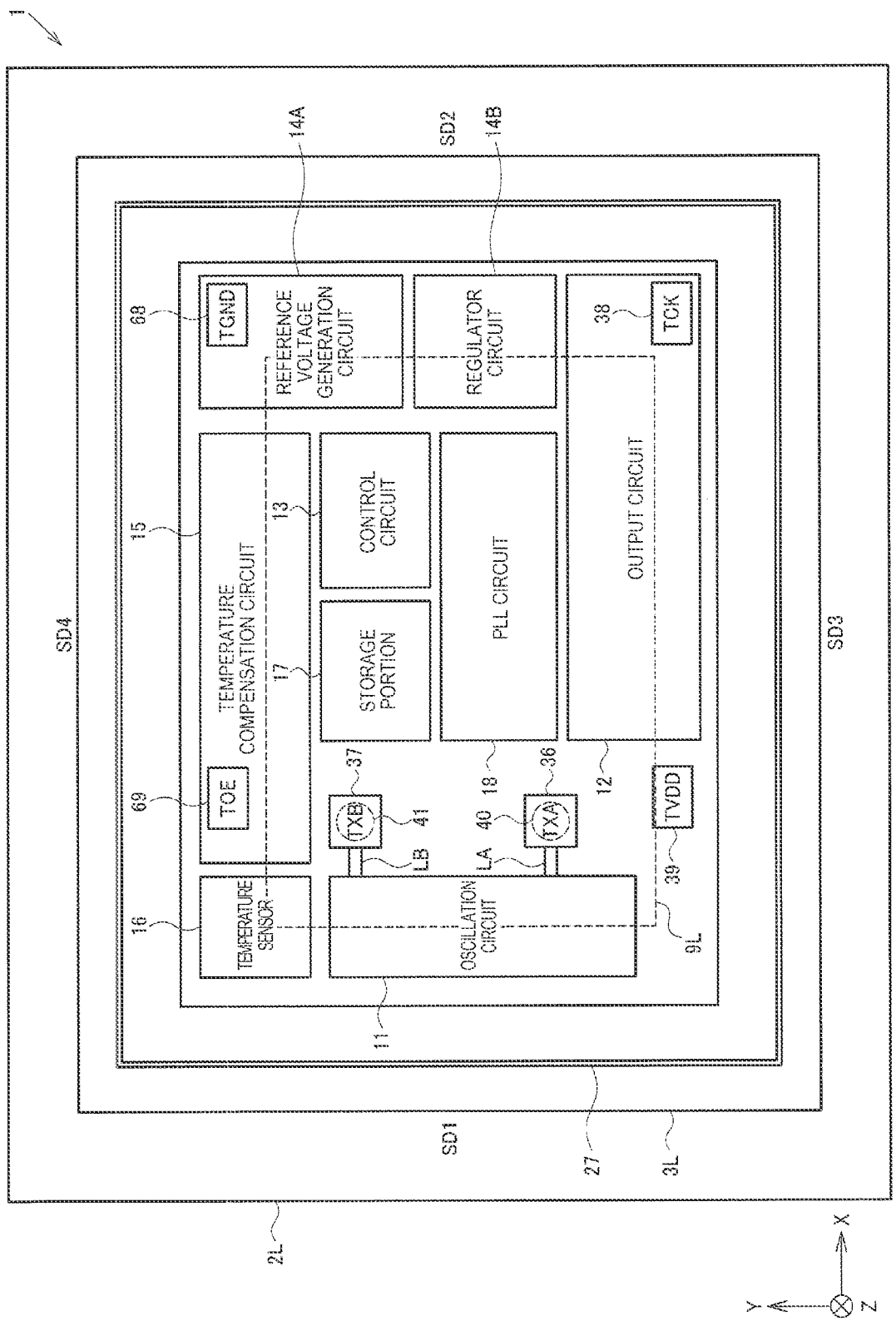

The present embodiment is not limited to the above, and various modifications can be performed. FIG. 17 is a plan view illustrating a modification example of the present embodiment. The vibrator device 1 may further include a PLL circuit 18.

For example, by providing a fractional N type PLL circuit 18, it becomes possible to output the clock signal CK having any frequency obtained by multiplying the frequency of the oscillation signal of the oscillation circuit 11. Further, the PLL circuit 18 is disposed inside the lid inner wall line 9L in a plan view, similar to the control circuit 13 and the like. That is, the PLL circuit 18 is disposed at a position that does not overlap with the joining portion JA in a plan view. This is because the PLL circuit 18 is corrected in a feedback loop so that the effect of the stress is considered to be small. As described above, by disposing the PLL circuit 18 at a position where the effect of the stress is large, it is possible to increase the room for disposing the circuit having a large effect of the stress at a position where the effect of the stress is small.

As described above, the vibrator device of the present embodiment includes a semiconductor substrate, a base, a vibrating element, and a lid. The semiconductor substrate has a first surface and a second surface which is in a front-back relationship with the first surface. The base includes an integrated circuit disposed on a first surface or a second surface. The vibrating element is electrically coupled to the integrated circuit and is disposed on the first surface side. The lid is joined to the base at a joining portion of the base to accommodate the vibrating element. The integrated circuit includes a passive element, and the passive element is disposed such that at least a part of the passive element overlaps with the joining portion in a plan view from a direction orthogonal to the first surface.

As described above, the vibrator device of the present embodiment includes the integrated circuit disposed on the first surface or the second surface of the semiconductor substrate. Further, the integrated circuit includes a passive element, and the passive element is disposed such that at least a part of the passive element overlaps with the joining portion, which is joined with the lid, in a plan view from a direction orthogonal to the first surface. By disposing in this way, it is possible to reduce the effect of the stress on the passive element as compared with the case where the passive element is disposed so as not to overlap with the joining portion in a plan view. As a result, the deformation of the passive element due to the effect of the stress can be reduced. As a result, the change in characteristics of the passive element can be reduced, so that the change in frequency characteristics of the vibrator device can be effectively reduced.

Further, the passive element may be at least one of a capacitance element and a resistance element.

In this way, the deformation of the capacitance element or the resistance element can be reduced by disposing the capacitance element or the resistance element at a position where the effect of the stress is small. As a result, it is possible to reduce a change in capacitance of the capacitance element or a resistance value of the resistance element. As a result, it is possible to reduce a change in oscillation frequency of the vibrator device.

Further, the capacitance element may be at least one of a metal-insulator-metal (MIM) capacitor, a polysilicon-insulator-polysilicon (PIP) capacitor, and a metal-oxide-semiconductor (MOS) capacitor.

In this way, the deformation of these capacitors can be reduced by disposing the capacitors usually used in the vibrator device at a position where the effect of the stress is small. As a result, changes in capacitance of these capacitors can be reduced. As a result, it is possible to reduce a change in oscillation frequency of the vibrator device.

Further, the integrated circuit may include the oscillation circuit that outputs the oscillation signal by oscillating the vibrating element, and the passive element may be at least one of the capacitance element or the resistance element included in the oscillation circuit.

In this way, by disposing the capacitance element or resistance element included in the oscillation circuit at a position where the effect of the stress is small, the deformation of the capacitance element or the resistance element included in the oscillation circuit can be reduced. As a result, it is possible to reduce a change in capacitance of the capacitance element or resistance value of the resistance element included in the oscillation circuit. As a result, it is possible to reduce a change in oscillation frequency of the vibrator device.

Further, the base may include a through electrode, and the integrated circuit may have a first side and a second side that faces the first side, and the oscillation circuit may be disposed between the first side and the through electrode in a plan view from a direction orthogonal to the first surface.

In this way, by disposing the oscillation circuit at a position close to the first side, it is possible to increase a distance between the oscillation circuit and the external coupling terminal disposed near the second side, and the capacitance of the capacitive coupling between the oscillation circuit and the external coupling terminal can be reduced.

Further, the integrated circuit may include a reference voltage generation circuit that generates a reference voltage used in the integrated circuit, and the passive element may be the resistance element included in the reference voltage generation circuit.

In this way, by disposing the resistance element included in the reference voltage generation circuit at a position where the effect of the stress is small, the deformation of the resistance element included in the reference voltage generation circuit can be reduced. As a result, it is possible to reduce a change in resistance value of the resistance element included in the reference voltage generation circuit. As a result, it is possible to reduce a change in oscillation frequency of the vibrator device.

Further, the integrated circuit may include a regulator circuit that generates a regulated power supply voltage used in the integrated circuit, and the passive element may be the resistance element included in the regulator circuit.

In this way, by disposing the resistance element included in the regulator circuit at a position where the effect of the stress is small, the deformation of the resistance element included in the regulator circuit can be reduced. As a result, it is possible to reduce a change in resistance value of the resistance element included in the regulator circuit. As a result, it is possible to reduce a change in oscillation frequency of the vibrator device.

Further, the integrated circuit may include a temperature sensor that detects the temperature, and the passive element may be the resistance element included in the temperature sensor.

In this way, by disposing the resistance element included in the temperature sensor at a position where the effect of the stress is small, the deformation of the resistance element included in the temperature sensor can be reduced. As a result, it is possible to reduce a change in resistance value of the resistance element included in the temperature sensor. As a result, it is possible to reduce a change in oscillation frequency of the vibrator device.

Further, the integrated circuit may include a temperature compensation circuit that performs a temperature compensation of an oscillation frequency of the vibrating element, and the passive element may be the resistance element included in the temperature compensation circuit.

In this way, by disposing the resistance element included in the temperature compensation circuit at a position where the effect of the stress is small, the deformation of the resistance element included in the temperature compensation circuit can be reduced. As a result, it is possible to reduce a change in resistance value of the resistance element included in the temperature compensation circuit. As a result, it is possible to reduce a change in oscillation frequency of the vibrator device.

Further, the integrated circuit may include a predetermined circuit disposed in a region that does not overlap with a joining portion in a plan view, and the predetermined circuit may include at least one of a control circuit and a memory circuit.

In this way, by disposing the control circuit or the memory circuit having less trouble due to the effect of the stress at the position where the effect of the stress is large, it is possible to increase the room for disposing a circuit having a large effect of the stress at a position where the effect of the stress is small.

Further, the vibrator device of the present embodiment includes a semiconductor substrate, a base, a vibrating element, and a lid. The semiconductor substrate has a first surface and a second surface which is in a front-back relationship with the first surface. The base includes an integrated circuit disposed on a first surface or a second surface. The vibrating element is electrically coupled to the integrated circuit and is disposed on the first surface side. The lid is joined to the base at a joining portion of the base to accommodate the vibrating element. The integrated circuit includes at least one of the reference voltage generation circuit that generates the reference voltage used in the integrated circuit and the regulator circuit that generates the regulated power supply voltage used in the integrated circuit. At least a part of the passive element or the active element included in at least one of the reference voltage generation circuit and the regulator circuit is disposed so as to overlap with the joining portion in a plan view from a direction orthogonal to the first surface.

In this way, by disposing the passive element or the active element included in the reference voltage generation circuit or the regulator circuit at a position where the effect of the stress is small, the deformation of the passive element or the active element included in the reference voltage generation circuit or the regulator circuit can be reduced. As a result, it is possible to reduce a change in characteristics of the passive element or the active element included in the reference voltage generation circuit or the regulator circuit. As a result, it is possible to reduce a change in oscillation frequency of the vibrator device.

Further, the vibrator device of the present embodiment includes a semiconductor substrate, a base, a vibrating element, and a lid. The semiconductor substrate has a first surface and a second surface which is in a front-back relationship with the first surface. The base includes an integrated circuit disposed on a first surface or a second surface. The vibrating element is electrically coupled to the integrated circuit and is disposed on the first surface side. The lid is joined to the base at a joining portion of the base to accommodate the vibrating element. The integrated circuit includes at least one of the temperature sensor that detects the temperature and the temperature compensation circuit that performs the temperature compensation of the oscillation frequency of the vibrating element. At least a part of the passive element or the active element included in at least one of the temperature sensor and the temperature compensation circuit is disposed so as to overlap with the joining portion in a plan view from a direction orthogonal to the first surface.

In this way, by disposing the passive element or the active element included in the temperature sensor or the temperature compensation circuit where the effect of the stress is small, the deformation of the passive element or the active element included in the temperature sensor or the temperature compensation circuit can be reduced. As a result, it is possible to reduce a change in characteristics of the passive element or the active element included in the temperature sensor or the temperature compensation circuit. As a result, it is possible to reduce a change in oscillation frequency of the vibrator device.

Although the present embodiment has been described in detail as described above, it will be easily understood by those skilled in the art that many modifications can be made without departing from the novel matters and effects of the present disclosure. Accordingly, all such modification examples are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configurations/operations of the vibrator device are not limited to those described in the present embodiment, and various modifications can be made.

What is claimed is:

1. A vibrator device comprising:
   a base including a semiconductor substrate, which has a first surface and a second surface that is in a front-back relationship with the first surface, and an integrated circuit, which is disposed on the first surface or the second surface;
   a vibrating element electrically coupled to the integrated circuit and disposed on a first surface side; and
   a lid joined to the base at a joining portion of the base so as to accommodate the vibrating element,
   wherein the integrated circuit includes a reference voltage generation circuit that generates a reference voltage supplied to the integrated circuit,
   the reference voltage generation circuit includes a resistance element,
   the reference voltage generation circuit is disposed such that at least a part of the reference voltage generation circuit overlaps with the joining portion in a plan view from a direction orthogonal to the first surface, and
   the resistance element is disposed in a region where the reference voltage generation circuit and the joining portion overlap in the plan view.

2. The vibrator device according to claim 1,
   wherein the integrated circuit includes an oscillation circuit that outputs an oscillation signal by oscillating the vibrating element,
   the oscillation circuit includes at least one of a capacitance element and the resistance element,
   the oscillation circuit is disposed such that at least a part of the oscillation circuit overlaps with the joining portion in the plan view, and
   at least one of the capacitance element and the resistance element is disposed in a region where the oscillation circuit and the joining portion overlap in the pain view.

3. The vibrator device according to claim 2,
   wherein the capacitance element is at least one of a metal-insulator-metal (MIM) capacitor, a polysilicon-insulator-polysilicon (PIP) capacitor, and a metal-oxide-semiconductor (MOS) capacitor.

4. The vibrator device according to claim 2, wherein the base includes a through electrode,
   the integrated circuit has a first side and a second side facing the first side, and
   the oscillation circuit is disposed between the first side and the through electrode, in the plan view.

5. The vibrator device according to claim 1,
wherein the integrated circuit includes a temperature compensation circuit that performs a temperature compensation of an oscillation frequency of the vibrating element,
the temperature compensation circuit includes a resistance element,
the temperature compensation circuit is disposed such that at least a part of the temperature compensation circuit overlaps with the joining portion in the plan view, and
the resistance element is disposed in a region where the temperature compensation circuit and the joining portion overlap in the plan view.

6. The vibrator device according to claim 1,
wherein the integrated circuit includes a predetermined circuit disposed in a region that does not overlap with the joining portion in the plan view, and
the predetermined circuit includes at least one of a control circuit and a memory circuit.

7. A vibrator device comprising:
a base including a semiconductor substrate, which has a first surface and a second surface that is in a front-back relationship with the first surface, and an integrated circuit, which is disposed on the first surface or the second surface;
a vibrating element electrically coupled to the integrated circuit and disposed on a first surface side; and
a lid joined to the base at a joining portion of the base so as to accommodate the vibrating element,
wherein the integrated circuit includes a regulator circuit that generates a regulated power supply voltage supplied to the integrated circuit,
the regulator circuit included at least one of a resistance element and a capacitance element,
the regulator circuit is disposed such that at least a part of the regulator circuit overlaps with the joining portion in a plan view from a direction orthogonal to the first surface, and
the at least one of the resistance element and the capacitance element is disposed in a region where the regulator circuit and the joining portion overlap in the plan view.

8. The vibrator device according to claim 7,
wherein the capacitance element is at least one of a metal-insulator-metal (MIM) capacitor, a polysilicon-insulator-polysilicon (PIP) capacitor, and a metal-oxide-semiconductor (MOS) capacitor.

9. A vibrator device comprising:
a base including a semiconductor substrate, which has a first surface and a second surface that is in a front-back relationship with the first surface, and an integrated circuit, which is disposed on the first surface or the second surface;
a vibrating element electrically coupled to the integrated circuit and disposed on a first surface side; and
a lid joined to the base at a joining portion of the base so as to accommodate the vibrating element,
wherein the integrated circuit includes a temperature sensor that detects temperature,
the temperature sensor includes a resistance element,
the temperature sensory is disposed such that at least part of the temperature sensor overlaps with the joining portion in a pain view from a direction orthogonal to the first surface, and
the resistance element is disposed in a region where the temperature sensor and the joining portion overlap in the plain view.

* * * * *